(12) United States Patent
Ho et al.

(10) Patent No.: US 12,087,838 B2
(45) Date of Patent: Sep. 10, 2024

(54) SELF-ALIGNED CONTACT HARD MASK STRUCTURE OF SEMICONDUCTOR DEVICE AND METHOD OF FORMING SAME

(71) Applicant: Taiwan Semiconductor Manufacturing Co., Ltd., Hsinchu (TW)

(72) Inventors: Tsai-Jung Ho, Xihu Township (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 386 days.

(21) Appl. No.: 17/668,144

(22) Filed: Feb. 9, 2022

(65) Prior Publication Data

US 2023/0044771 A1 Feb. 9, 2023

Related U.S. Application Data

(60) Provisional application No. 63/229,615, filed on Aug. 5, 2021.

(51) Int. Cl.
*H01L 29/423* (2006.01)
*H01L 21/8234* (2006.01)
*H01L 29/66* (2006.01)
*H01L 29/786* (2006.01)

(52) U.S. Cl.
CPC ........... *H01L 29/42392* (2013.01); *H01L 21/823418* (2013.01); *H01L 21/823468* (2013.01); *H01L 29/66545* (2013.01); *H01L 29/6656* (2013.01); *H01L 29/78618* (2013.01)

(58) Field of Classification Search
CPC ....... H01L 29/42392; H01L 21/823418; H01L 21/823468; H01L 29/66545; H01L 29/6656; H01L 29/78618; H01L 21/823437; H01L 21/02063; H01L 21/31116; H01L 21/76832; H01L 21/76834; H01L 21/76897; H01L 21/823475; H01L 27/088; H01L 29/66636; H01L 29/165; H01L 29/665; H01L 29/6653; H01L 29/7848; H01L 21/0332; H01L 21/0337
See application file for complete search history.

(56) References Cited

U.S. PATENT DOCUMENTS 10,854,506 B2 * 12/2020 Liang .................. H01L 23/5283
11,894,435 B2 * 2/2024 Chou ................. H01L 21/76816
11,961,731 B2 * 4/2024 Hsiao ................ H01L 21/76805

OTHER PUBLICATIONS

Hong Xiao, "Introduction to Semiconductor Manufacturing Technology Second Edition" SPIE Press, 2012, 3 pages.

* cited by examiner

*Primary Examiner* — Douglas W Owens
(74) *Attorney, Agent, or Firm* — Slater Matsil, LLP

(57) ABSTRACT

A device includes a substrate including an active region, a gate stack over the active region, and a hard mask over the gate stack. The hard mask includes a capping layer, a buttress layer extending along sidewalls and a bottom of the capping layer, and a liner layer extending along sidewalls and a bottom of the buttress layer. The buttress layer includes a metal oxide material or a metal nitride material.

20 Claims, 27 Drawing Sheets

| Embodiments SAC Hard Mask Layers | #1 | #2 | #3 | #4 | #5 |
|---|---|---|---|---|---|
| Layer 140A | SiN | TiN | AlN | TiO, TiN, HfO, AlO, AlN, ZrO, or ZrN | SiN |
| Layer 140B | TaN, TiO, TiN, Si, HfO AlO, AlN, ZrO, or ZrN | AlN | TiN | SiN | TaN, AlN, or TiN |
| Layer 140C | SiN | SiN | SiN | - | - |

Figure 14

SELF-ALIGNED CONTACT HARD MASK STRUCTURE OF SEMICONDUCTOR DEVICE AND METHOD OF FORMING SAME

PRIORITY CLAIM AND CROSS-REFERENCE

This application claims the benefit of U.S. Provisional Application No. 63/229,615, filed on Aug. 5, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 14 is a table illustrating various possible materials for various layers of a self-aligned contact hard mask in accordance with some embodiments.

DETAILED DESCRIPTION

Figure 1:
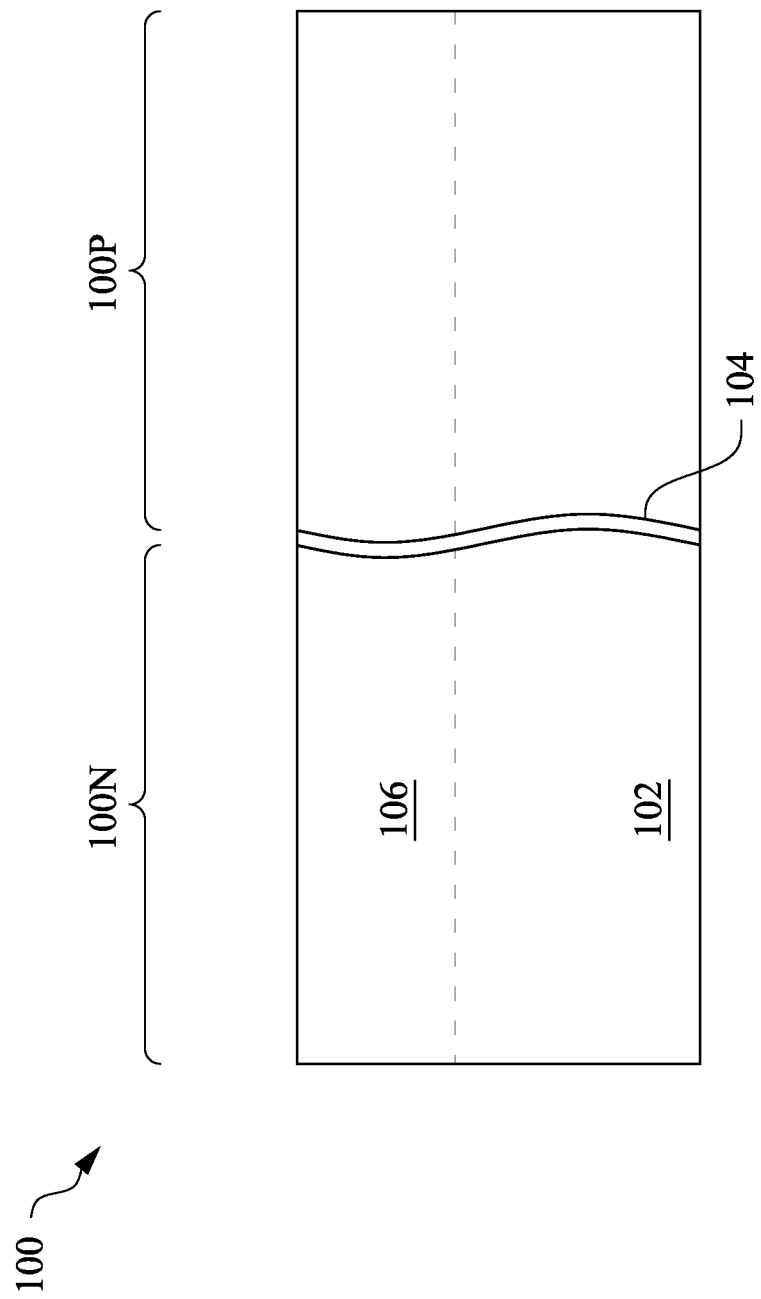
FIGS. 1-13, 15-17, and 21-26 are cross-sectional views of intermediate stages in the manufacturing of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a self-aligned contact (SAC) hard mask of a semiconductor device and a method of forming the same. Various embodiments presented herein are discussed in the context of a planar filed-effect transistor (FET) device formed using a gate-last process. In other embodiments, a gate-first process may be used. Various embodiments may be applied, however, to dies comprising other types of transistors (e.g., FinFETs, gate-all-around (GAA) transistors (such as, for example, nano-FETs), or the like) in lieu of or in combination with the planar FETs. Various embodiments discussed herein allow for forming a SAC hard mask comprising a buttress layer and having improved etching resistance, such that corner loss of the SAC hard mask during an etching process for forming openings for source/drain contacts is reduced and good insulation between adjacent source/drain contacts is maintained.

FIGS. 1-13, 15-17, and 21-26 are cross-sectional views of intermediate stages in the manufacturing of a semiconductor device 100 in accordance with some embodiments. In FIG. 1, a substrate 102 is provided. The substrate 102 may be a semiconductor substrate, such as a bulk semiconductor, a semiconductor-on-insulator (SOI) substrate, or the like, which may be doped (e.g., with a p-type or an n-type dopant) or undoped. The substrate 102 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 102 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 102 has a region 100N and a region 100P. The region 100N can be for forming n-type devices, such as n-type transistors. The region 100P can be for forming p-type devices, such as p-type transistors. The region 100N may be physically separated from the region 100P (as illustrated by a divider 104), and any number of device features (e.g., other active devices, doped regions, isolation structures, etc.) may be disposed between the region 100N and the region 100P.

The substrate 102 comprises an active region 106. In some embodiments when the semiconductor device 100 is a planar FET device, the active region 106 comprises an upper planar portion of the substrate 102. In other embodiments when the semiconductor device 100 is a planar FET device, the active region 106 is a semiconductor layer formed over the substrate 102, such that the semiconductor layer and the substrate 102 comprise different semiconductor materials. In some embodiments when the semiconductor device 100 is a FinFET device, the active region 106 comprises one or more semiconductor strips. The semiconductor strips may be also referred to as fins. In some embodiments, the semiconductor strips and the substrate 102 comprise a same semiconductor material. In other embodiments, the semiconductor strips and the substrate 102 comprise different semiconductor materials. The semiconductor strips may be separated and isolated from each other by isolation regions. In some embodiments when the semiconductor device 100 is a GAA device such as nanoFET device, the active region 106 comprises one or more nanostructures. The nanostructures may comprise nanosheets, nanowires, or the like. In some embodiments, the nanostructures and the substrate 102 comprise a same semiconductor material. In other embodiments, the nanostructures and the substrate 102 comprise different semiconductor materials.

Further in FIG. 1, appropriate wells (not shown) may be formed in the active region 106 of the substrate 102. In some embodiments, a P well may be formed in the region 100N, and an N well may be formed in the region 100P. In some embodiments, a P well or an N well are formed in both the region 100N and the region 100P. In the embodiments with different well types, the different implant steps for the region 100N and the region 100P may be achieved using a photoresist or other masks (not shown). For example, a first photoresist may be formed over the active region 106 of the substrate 102 in both the region 100N and the region 100P. The first photoresist is patterned to expose the region 100P. The first photoresist can be formed by using a spin-on technique and can be patterned using acceptable photolithography techniques. Once the first photoresist is patterned, an n-type impurity implantation is performed in the region 100P, while the remaining portion of the first photoresist acts as a mask to substantially prevent n-type impurities from being implanted into the region 100N. The n-type impurities may be phosphorus, arsenic, antimony, a combination thereof, or the like. After the implantation, the first photoresist is removed by an acceptable ashing process followed by a wet clean process, for example.

Following the implantation of the region 100P, a second photoresist is formed over the active region 106 of the substrate 102 in both the region 100P and the region 100N. The second photoresist is patterned to expose the region 100N. The second photoresist can be formed by using a spin-on technique and can be patterned using acceptable photolithography techniques. Once the second photoresist is patterned, a p-type impurity implantation may be performed in the region 100N, while the remaining portion of the second photoresist acts as a mask to substantially prevent p-type impurities from being implanted into the region 100P. The p-type impurities may be boron, $BF_2$, indium, a combination thereof, or the like. After the implantation, the second photoresist may be removed by an acceptable ashing process followed by a wet clean process, for example. After performing the implantations of the region 100N and the region 100P, an anneal process may be performed to activate the p-type and/or n-type impurities that were implanted.

Figure 2:
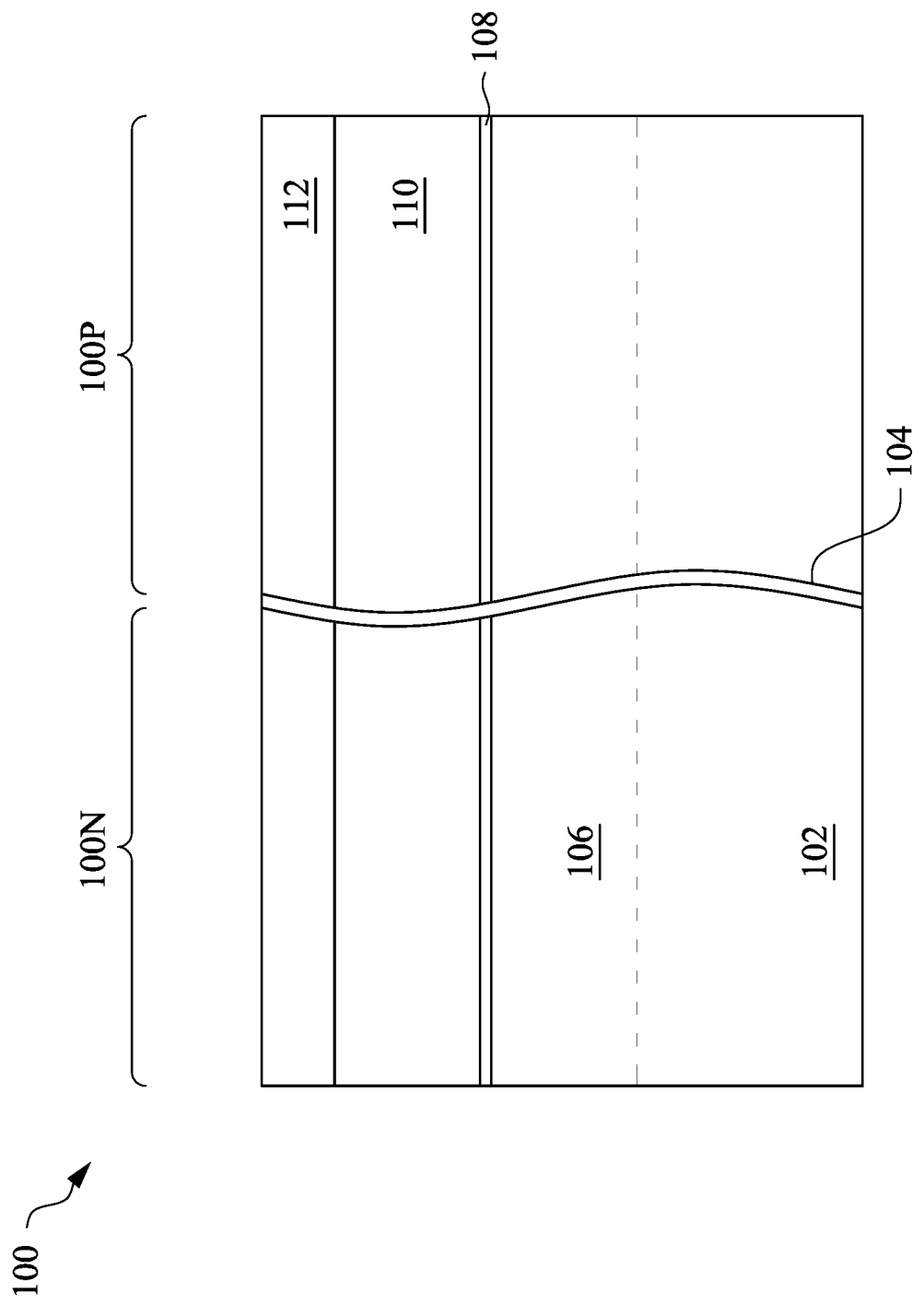

In FIG. 2, a dummy dielectric layer 108 is formed over the active region 106 of the substrate 102. The dummy dielectric layer 108 may be, for example, silicon oxide, silicon nitride, a combination thereof, or the like, and may be deposited or thermally grown according to acceptable techniques. Subsequently, a dummy gate layer 110 is formed over the dummy dielectric layer 108, and a mask layer 112 is formed over the dummy gate layer 110.

The dummy gate layer 110 may be deposited over the dummy dielectric layer 108 and then planarized using, for example, a chemical mechanical polishing (CMP) process. The dummy gate layer 110 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 110 may be deposited by physical vapor deposition (PVD), chemical vapor deposition (CVD), sputter deposition, or other techniques known and used in the art for depositing conductive materials.

The mask layer 112 may be deposited over the dummy gate layer 110. The mask layer 112 may include, for example, one or more layers of silicon oxide, silicon nitride, silicon oxynitride, a combination thereof, or the like. In some embodiments, the mask layer 112 may comprise a layer of silicon nitride and a layer of silicon oxide over the layer of silicon nitride.

In some embodiments, a single dummy dielectric layer 108, a single dummy gate layer 110, and a single mask layer 112 are formed over both the region 100N and the region 100P. In other embodiments, a first dummy dielectric layer, a first dummy gate layer, and a first mask layer are formed in the region 100N and a second dummy dielectric layer, a second dummy gate layer, and a second mask layer are formed in the region 100P, such that the first dummy dielectric layer and the second dummy dielectric layer comprise different materials, the first dummy gate layer and the second dummy gate layer comprise different materials, and the first mask layer and the second mask layer comprise different materials.

FIGS. 3-13, 15-17, and 21-26 illustrate various additional steps in the manufacturing of the semiconductor device 100 in accordance with some embodiments. FIGS. 3-13, 15-17, and 21-26 illustrate features in either of the region 100N and the region 100P. For example, the structures illustrated in FIGS. 3-13, 15-17, and 21-26 may be applicable to both the region 100N and the region 100P. Differences (if any) in the structures of the region 100N and the region 100P are described in the text accompanying each figure.

Figure 3:
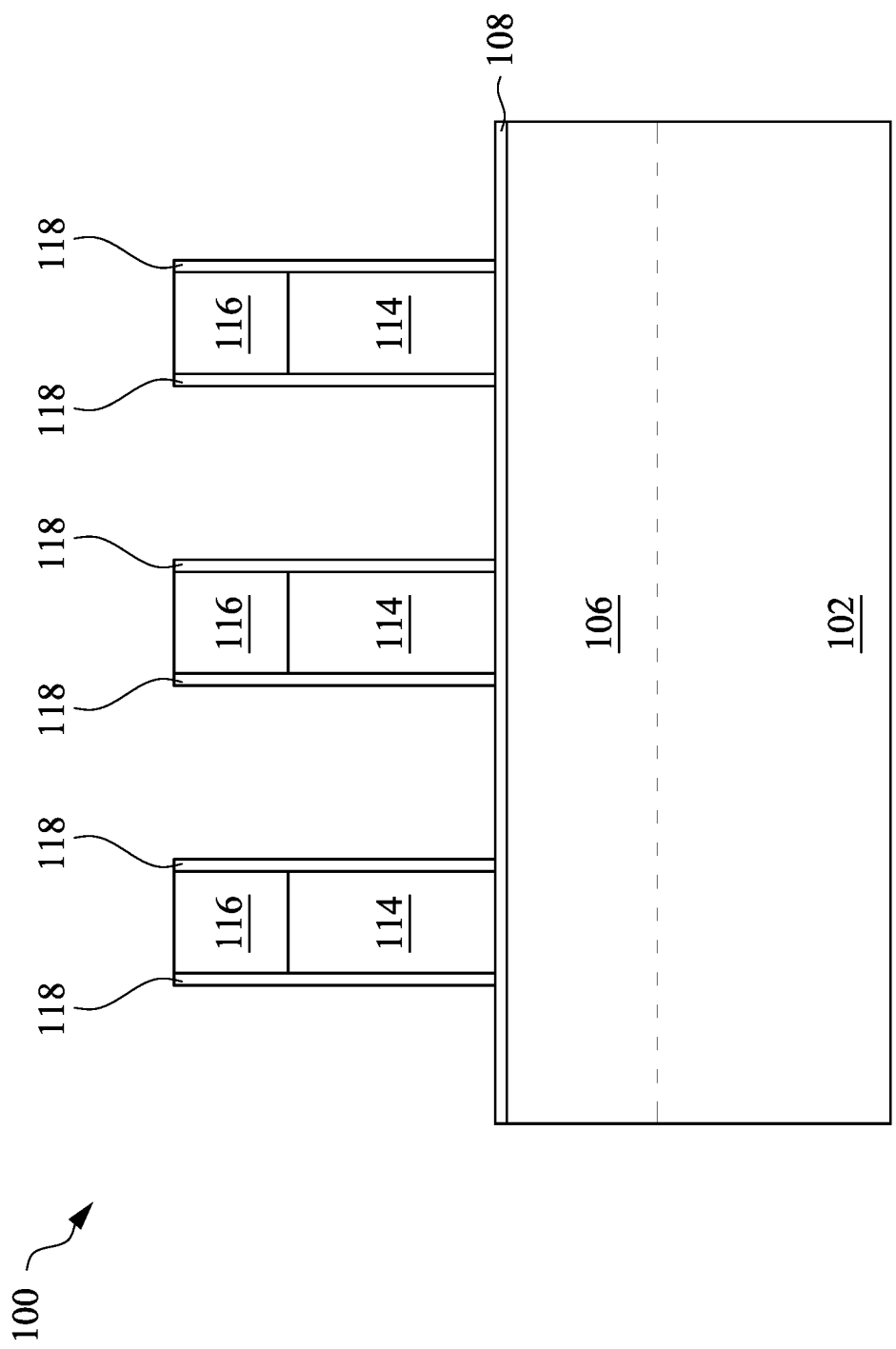

In FIG. 3, the mask layer 112 (see FIG. 2) may be patterned using acceptable photolithography and etch techniques to form masks 116. In some embodiments, the etch techniques may include one or more anisotropic etch processes such as a reactive ion etch (RIE), neutral beam etch (NBE), a combination thereof, or the like. Subsequently, the pattern of the masks 116 may be transferred to the dummy gate layer 110 (see FIG. 2) to form dummy gates 114. In some embodiments, the pattern of the masks 116 may also be transferred to the dummy dielectric layer 108 by an acceptable etch technique. As described below in greater detail, the dummy gates 114 are sacrificial gates and are subsequently replaced by replacement gates. Accordingly, dummy gates 114 may also be referred to as sacrificial gates. In other embodiments, some of the dummy gates 114 are not replaced and remain in the final structure of the semiconductor device 100.

Further in FIG. 3, gate seal spacers 118 may be formed on sidewalls of the dummy gates 114 and the respective masks 116. A thermal oxidation or a deposition followed by an anisotropic etch may form the gate seal spacers 118. The gate seal spacers 118 may comprise silicon oxide, silicon nitride, silicon oxynitride, SiCN, SiOC, SiOCN, a combination thereof, or the like.

After the formation of the gate seal spacers 118, implants for lightly doped source/drain (LDD) regions (not explicitly illustrated) may be performed. In the embodiments with different device types, similar to the implants discussed above in FIG. 1, a mask, such as a photoresist, may be formed over the region 100N, while exposing the region 100P, and appropriate type (e.g., p-type) impurities may be implanted into the active region 106 of the substrate 102 in the region 100P. The mask may then be removed. Subsequently, a mask, such as a photoresist, may be formed over the region 100P, while exposing the region 100N, and appropriate type impurities (e.g., n-type) may be implanted into the active region 106 of the substrate 102 in the region 100N. The mask may then be removed. The n-type impurities may be the any of the n-type impurities previously discussed, and the p-type impurities may be the any of the p-type impurities previously discussed. An anneal may be used to activate the implanted impurities.

Figure 4:
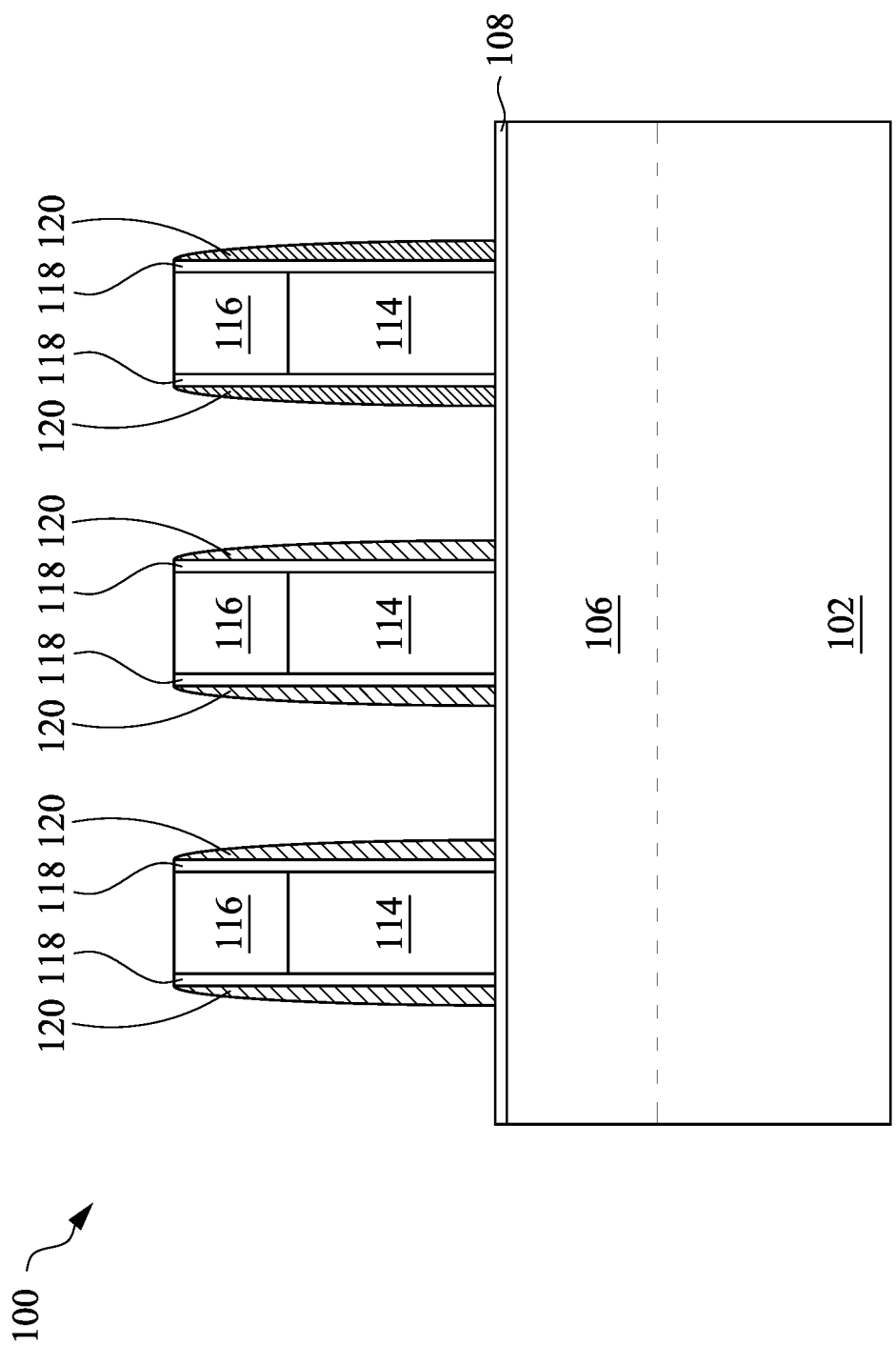

In FIG. 4, gate spacers 120 are formed on the gate seal spacers 118 along the sidewalls of the dummy gates 114 and the masks 116. The gate spacers 120 may be formed by blanket or conformally depositing an insulating material and subsequently anisotropically etching the insulating material. The insulating material of the gate spacers 120 may comprise silicon oxide, silicon nitride, silicon oxynitride, SiCN, SiOC, SiOCN, a combination thereof, or the like. In some embodiments, each of the gate spacers 120 may comprise a plurality of layers (not shown), such that the layers comprise different materials.

It is noted that the above disclosure generally describes a process of forming spacers and LDD regions. Other processes and sequences may be used. For example, fewer or additional spacers may be utilized, different sequence of steps may be utilized (e.g., the gate seal spacers 118 may not be etched prior to forming the gate spacers 120, respectively, yielding "L-shaped" gate seal spacers, spacers may be formed and removed, and/or the like). Furthermore, the n-type and p-type devices may be formed using a different structures and steps. For example, LDD regions for n-type devices in the region 100N may be formed prior to forming the gate seal spacers 118, while the LDD regions for p-type devices in the region 100P may be formed after forming the gate seal spacers 118.

Figure 5:
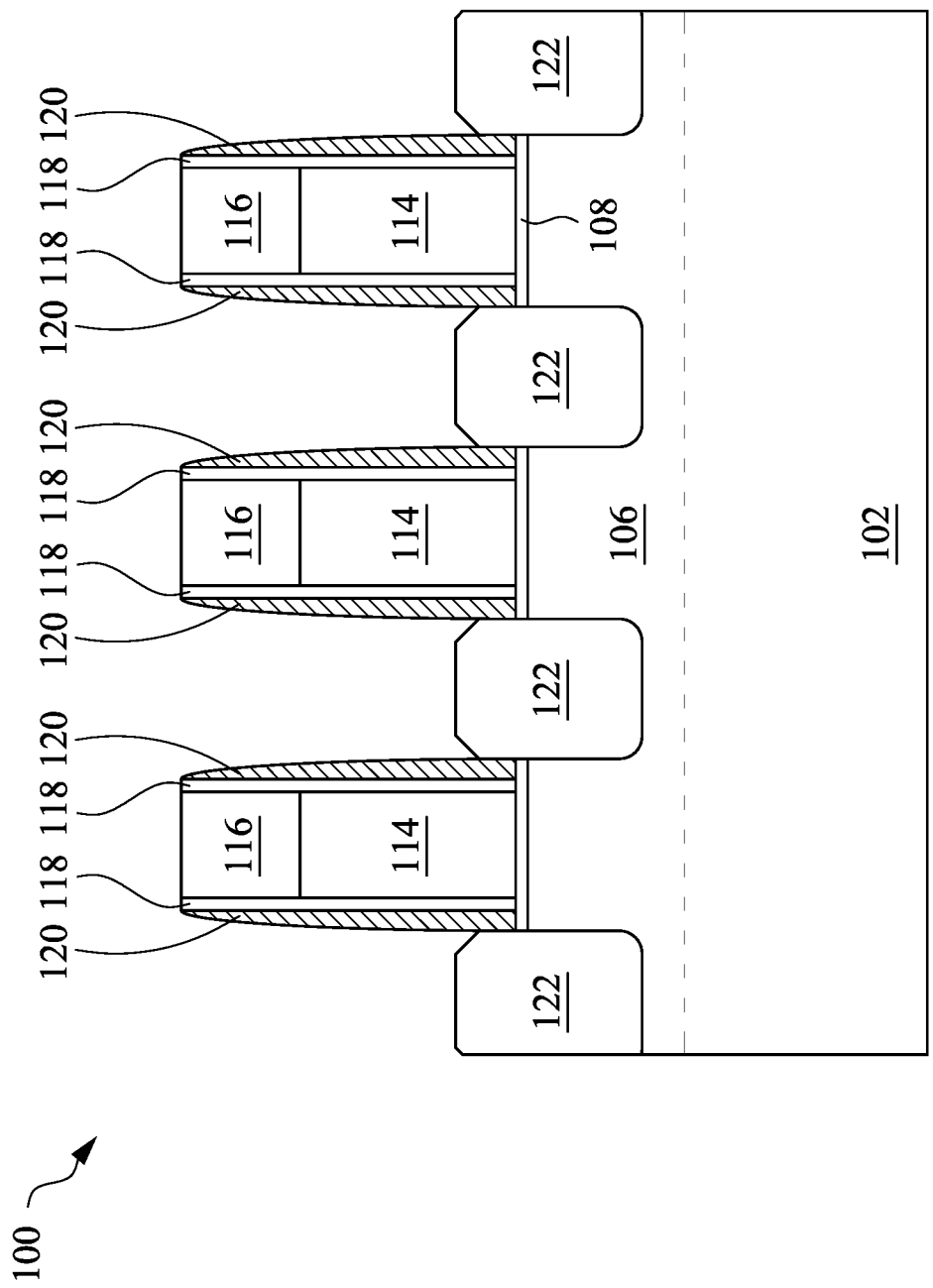

In FIG. 5, epitaxial source/drain regions 122 are formed in the active region 106 to exert stress in respective channel regions, thereby improving device performance. The epitaxial source/drain regions 122 are formed in the active region 106 such that each dummy gate 114 is disposed between respective neighboring pairs of the epitaxial source/drain regions 122. In some embodiments, the epitaxial source/drain regions 122 may extend into and may also penetrate through the active region 106. In some embodiments, the gate spacers 120 are used to separate the epitaxial source/drain regions 122 from the dummy gates 114 by an appropriate lateral distance so that the epitaxial source/drain regions 122 do not short out subsequently formed gates of the semiconductor device 100.

The epitaxial source/drain regions 122 in the region 100N may be formed by masking the region 100P and etching exposed portions of the active region 106 in the region 100N to form recesses in the active region 106. Then, the epitaxial source/drain regions 122 in the region 100N are epitaxially grown in the recesses. The epitaxial source/drain regions 122 may include any acceptable material, such as appropriate for n-type transistors. For example, if the active region 106 is made of silicon, the epitaxial source/drain regions 122 in the region 100N may include materials exerting a tensile strain in respective channel regions of the semiconductor device 100, such as silicon, SiC, SiCP, SiP, a combination thereof, or the like. The epitaxial source/drain regions 122 in the region 100N may have facets.

The epitaxial source/drain regions 122 in the region 100P may be formed by masking the region 100N and etching exposed portions of the active region 106 in the region 100P to form recesses in the active region 106. Then, the epitaxial source/drain regions 122 in the region 100P are epitaxially grown in the recesses. The epitaxial source/drain regions 122 may include any acceptable material, such as appropriate for p-type transistors. For example, if the active region 106 made of silicon, the epitaxial source/drain regions 122 in the region 100P may comprise materials exerting a compressive strain in respective channel regions of the semiconductor device 100, such as SiGe, SiGeB, Ge, GeSn, a combination thereof, or the like. The epitaxial source/drain regions 122 in the region 100P may have facets.

The epitaxial source/drain regions 122 may be implanted with dopants to form source/drain regions, similar to the process previously discussed for forming lightly-doped source/drain regions, followed by an anneal. The n-type and/or p-type impurities for the epitaxial source/drain regions 122 may be any of the impurities previously discussed. In some embodiments, the epitaxial source/drain regions 122 may be in situ doped during growth.

Figure 6:
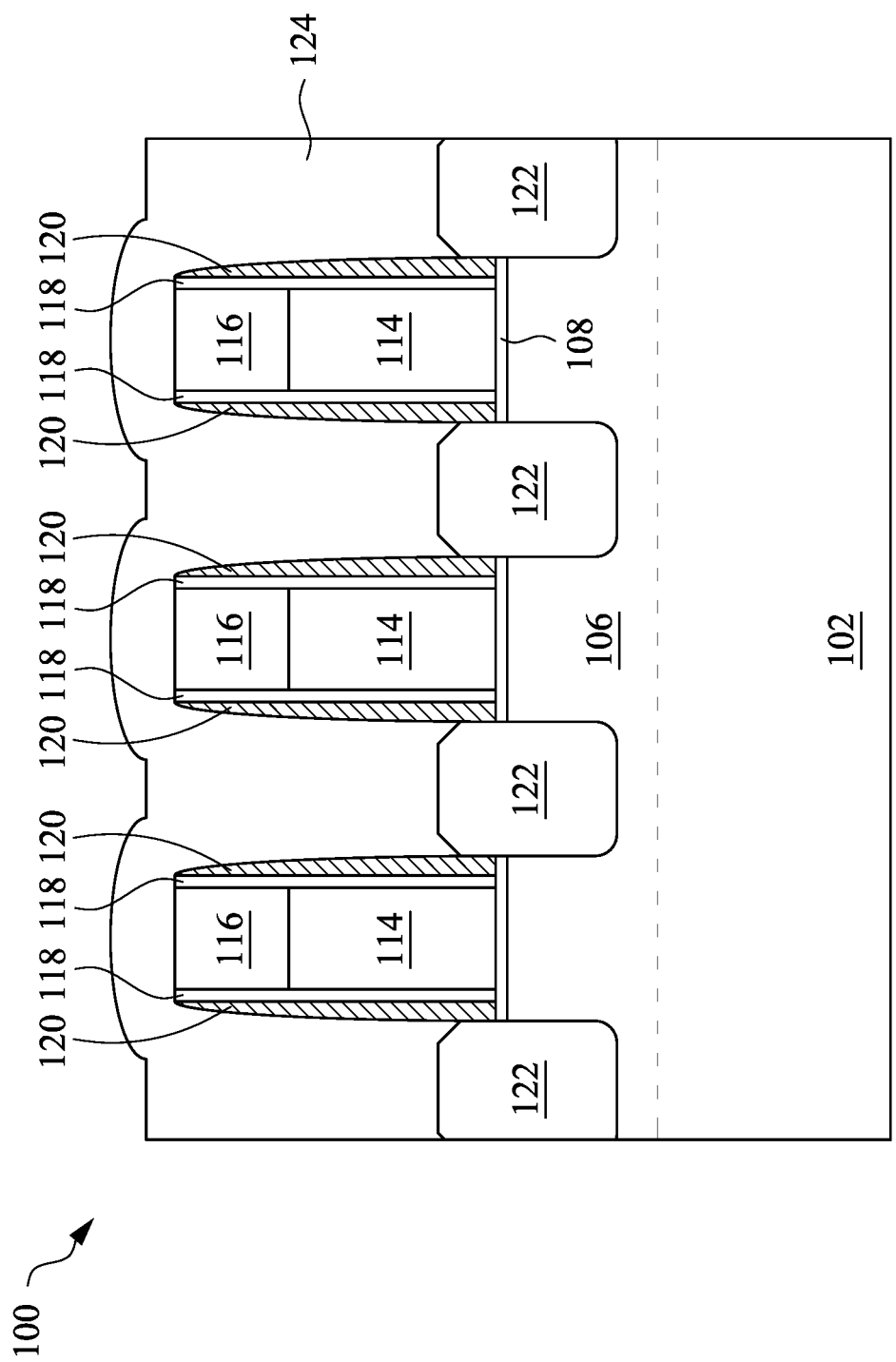

In FIG. 6, an ILD 124 is deposited over the structure illustrated in FIG. 5. The ILD 124 may be formed of a dielectric material, and may be deposited by any suitable method, such as CVD, plasma-enhanced CVD (PECVD), flowable CVD (FCVD), a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), a combination thereof, or the like. Other insulation materials formed by any acceptable process may be also used. In some embodiments, a contact etch stop layer (not shown) may be disposed between the ILD 124 and the epitaxial source/drain regions 122, the masks 116, and the gate spacers 120. The contact etch stop layer may comprise a dielectric material, such as, silicon nitride, silicon oxide, silicon oxynitride, a combination thereof, or the like, having a different etch rate than the material of the overlying ILD 124.

Figure 7:
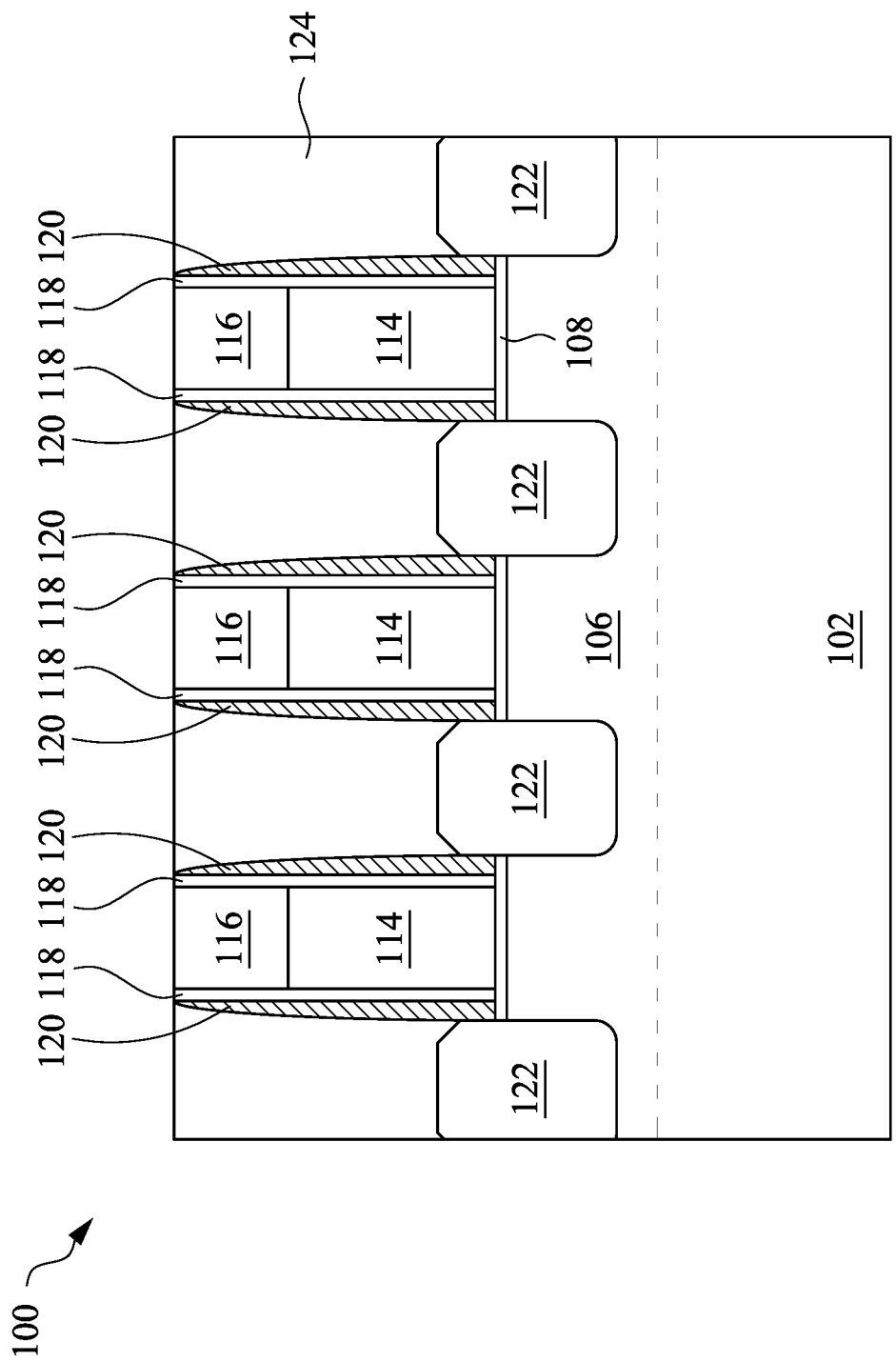

In FIG. 7, a planarization process, such as a CMP process, may be performed to level the top surface of the ILD 124 with the top surfaces of the masks 116. In some embodiments, the planarization process may also remove the masks 116 on the dummy gates 114, and portions of the gate seal spacers 118 and the gate spacers 120 along the sidewalls of the masks 116. In the illustrated embodiment, after the planarization process, top surfaces of the masks 116, the gate seal spacers 118, the gate spacers 120, and the ILD 124 are substantially coplanar or level with each other within process variations of the planarization process. Accordingly, the top surfaces of the masks 116 are exposed through the ILD 124. In embodiments when the masks 116 are also removed, the planarization process levels the top surface of the ILD 124 with top surfaces of the dummy gates 114.

Figure 8:
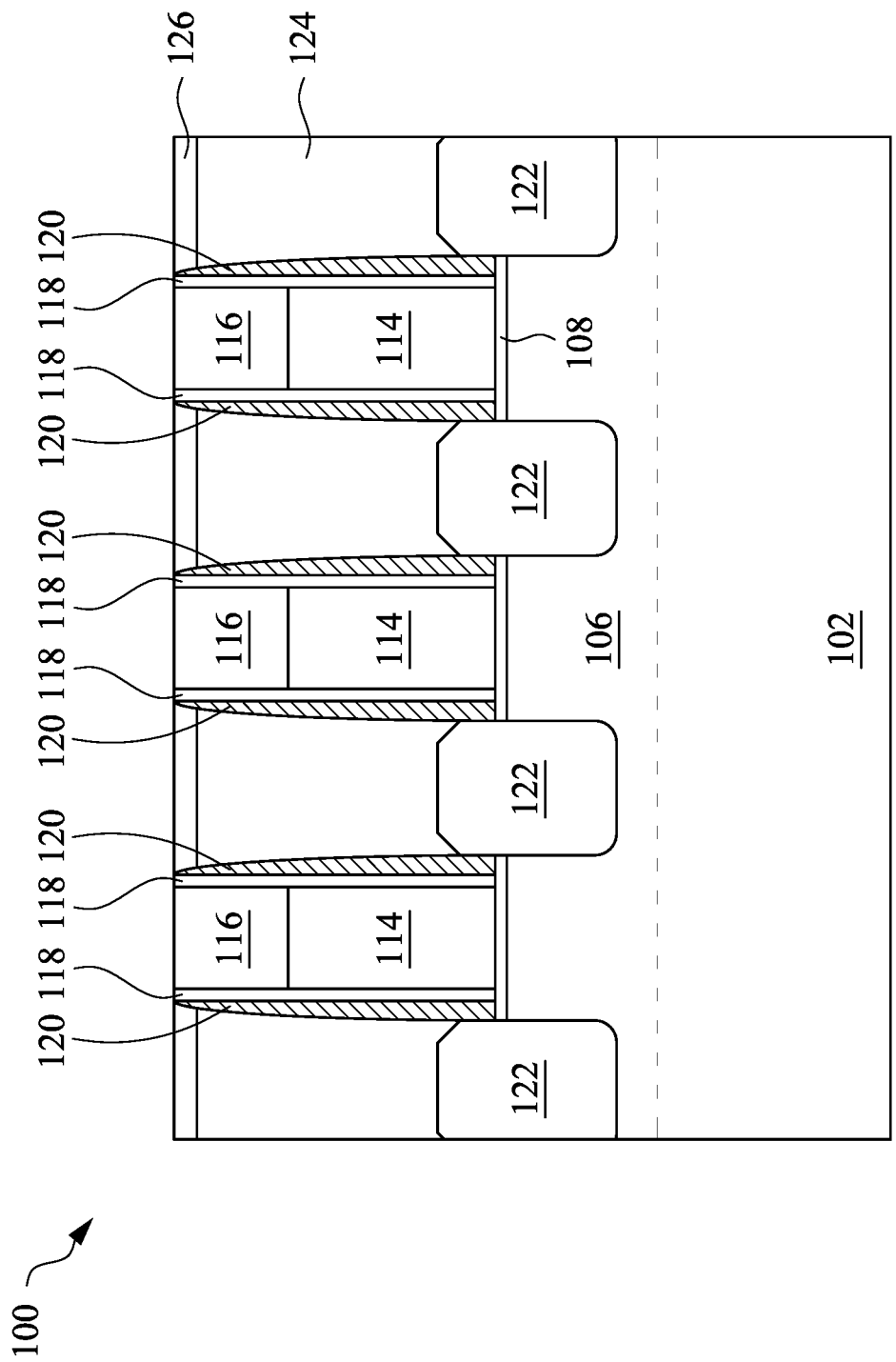

In FIG. 8, a protection layer 126 is formed over the ILD 124. The protection layer 126 protects the ILD 124 from subsequent process steps. The protection layer 126 may also be referred to as an etch stop layer. In some embodiments, the ILD 124 is recessed below the top surfaces of the masks 116, a material of the protection layer 126 is deposited in the formed recesses, and a planarization process, such as a CMP process, is performed to level a top surface of the protection layer 126 with the top surfaces of the masks 116. In some embodiments, the protection layer 126 may comprise SiN, SiC, SiCN, SiCO, a combination thereof, or the like, and may be deposited using ALD, CVD, a combination thereof, or the like.

Figure 9:
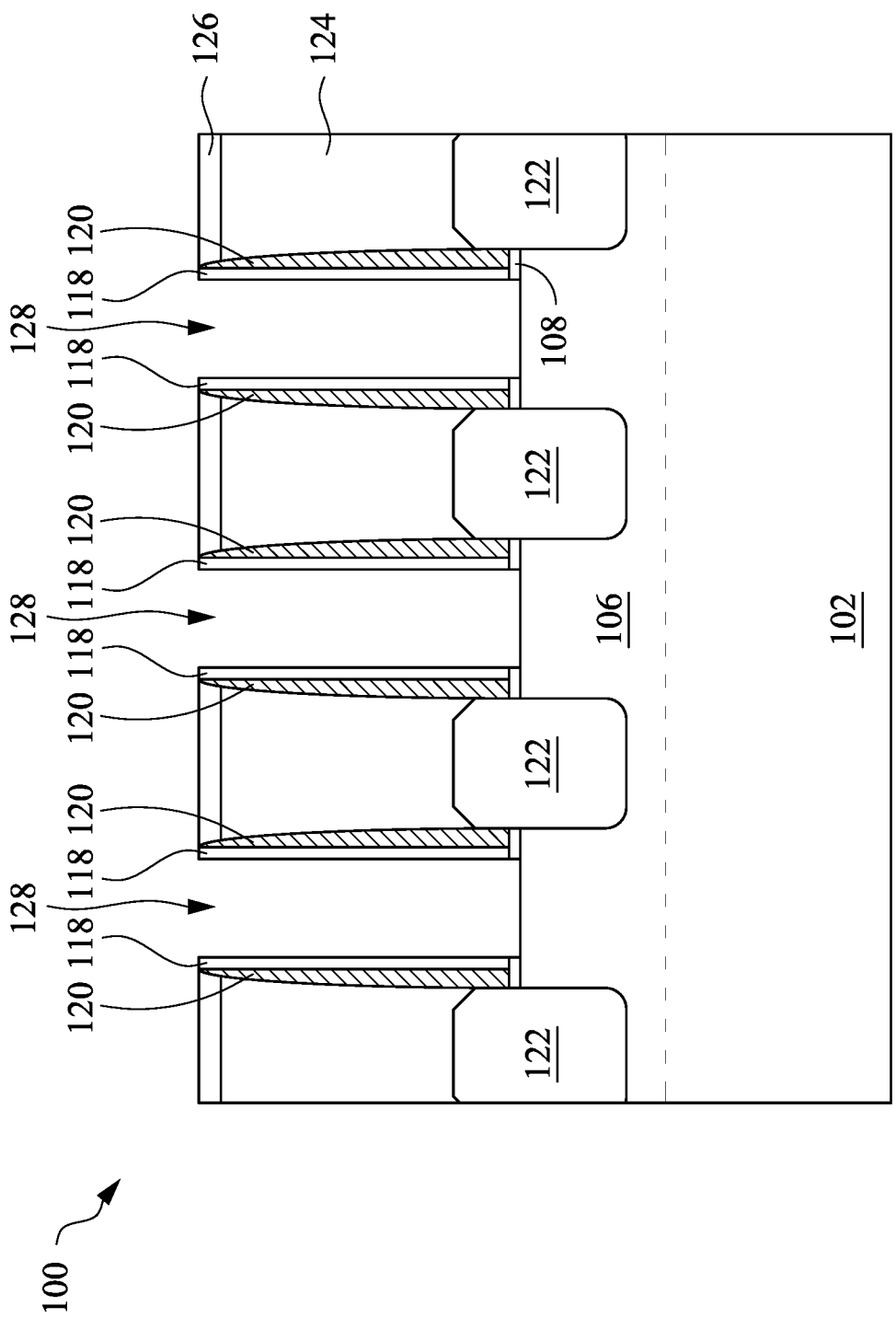

In FIG. 9, the dummy gates 114 and the masks 116 (see FIG. 8) are removed in an etching step(s), so that openings 128 are formed. In some embodiments, portions of the dummy dielectric layer 108 in the openings 128 may also be removed. In other embodiments, only the dummy gates 114 are removed and the dummy dielectric layer 108 remains and is exposed by the openings 128. In some embodiments, the dummy dielectric layer 108 is removed from the openings 128 in a first region of a die (e.g., a core logic region) and remains in openings 128 in a second region of the die (e.g., an input/output region). In some embodiments, the dummy gates 114 and the masks 116 are removed by an anisotropic dry etch process. For example, the etch process may include a dry etch process using reaction gas(es) that selectively etch the dummy gates 114 and the masks 116 without etching the protection layer 126, the gate seal spacers 118, and the gate spacers 120. Each opening 128 exposes a respective channel region of the active region 106. Each channel region is disposed between neighboring pairs of the epitaxial source/drain regions 122. During the removal, the dummy dielectric layer 108 may be used as an etch stop layer when the dummy gates 114 and the masks 116 are etched. The dummy dielectric layer 108 may then be optionally removed after the removal of the dummy gates 114 and the masks 116.

Figure 10:
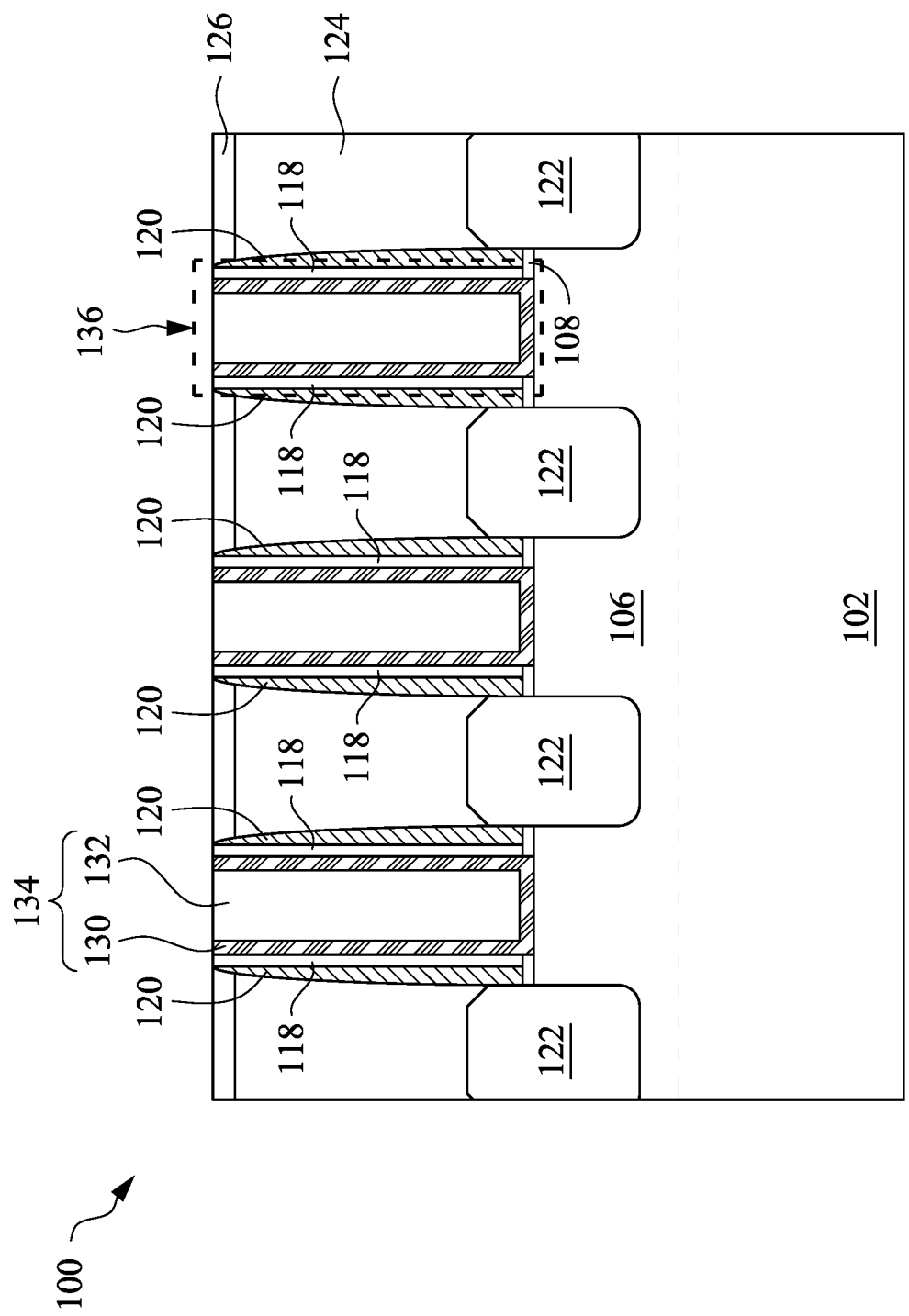
Figure 11:
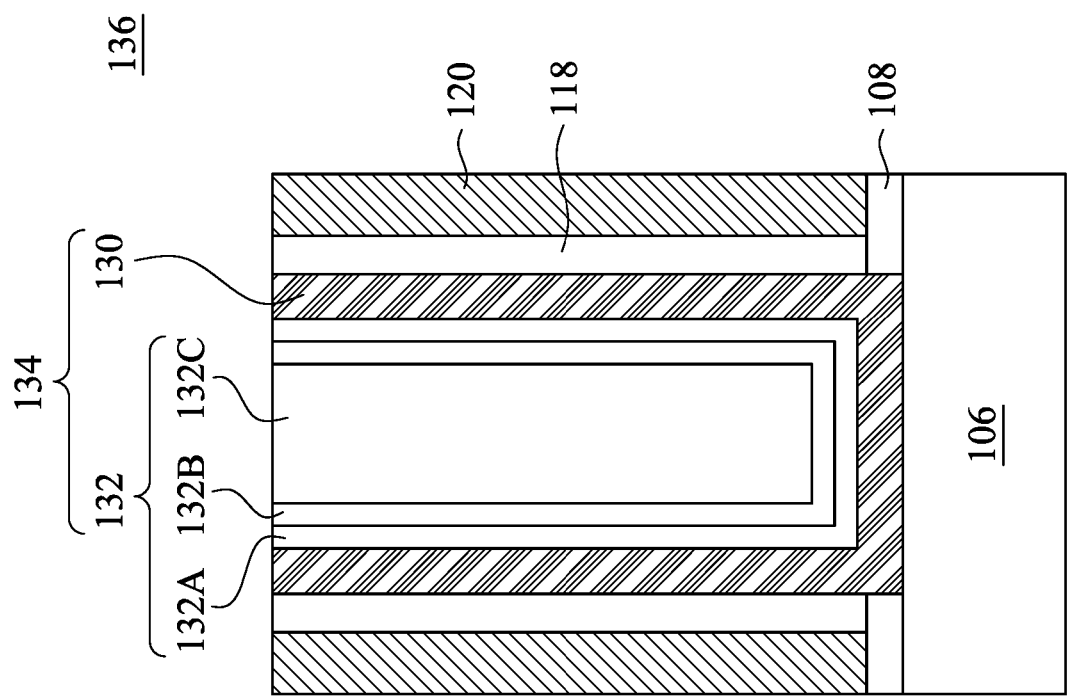

In FIG. 10, gate dielectric layers 130 and gate electrodes 132 are formed in the openings 128 (see FIG. 9) to form gate stacks 134. The gate stacks 134 may be also referred to as replacement gate stacks. FIG. 11 illustrates a detailed view of a region 136 of FIG. 10. In some embodiments, a material of the gate dielectric layers 130 is formed in the openings 128 (see FIG. 9). The material of the gate dielectric layers 130 may also be formed on the top surface of the protection layer 126. In some embodiments, the gate dielectric layers 130 comprise silicon oxide, silicon nitride, or multilayers thereof. In some embodiments, the gate dielectric layers 130 include a high-k dielectric material, and in these embodiments, the gate dielectric layers 130 may have a k value greater than about 7.0, and may include a metal oxide or a silicate of hafnium, aluminum, zirconium, lanthanum, manganese, barium, titanium, lead, and combinations thereof. The formation methods of the gate dielectric layers 130 may include Molecular-Beam Deposition (MBD), ALD, PECVD, a combination thereof, or the like.

Subsequently, a material of the gate electrodes 132 is deposited over the gate dielectric layers 130 and fills the remaining portions of the openings 128 (see FIG. 9). Although a single layer gate electrode 132 is illustrated in FIG. 10, the gate electrode 132 may comprise any number of liner layers 132A, any number of work function tuning layers 132B, and a conductive fill layer 132C as illustrated by FIG. 11. The liner layers 132A may include TiN, TiO, TaN, TaC, combinations thereof, multi-layers thereof, or the like, and may be formed using PVD, CVD, ALD, a combination thereof, or the like. In region 100N, the work function tuning layers 132B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In region 100P, the work function tuning layers 132B may include TiN, WN, TaN, Ru, Co, combinations thereof, multi-layers thereof, or the like, and may be formed using PVD, CVD, ALD, a combination thereof, or the like. In some embodiments, the conductive fill layer 132C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, plating, a combination thereof, or the like.

After the filling of the openings 128 (see FIG. 9), a planarization process, such as a CMP, may be performed to remove the excess portions of the gate dielectric layers 130 and the gate electrodes 132, which excess portions are over the top surface of the protection layer 126. The remaining portions of the gate electrodes 132 and the gate dielectric layers 130 thus form the gate stacks 134 of the semiconductor device 100.

The formation of the gate dielectric layers 130 in the region 100N and the region 100P may occur simultaneously such that the gate dielectric layers 130 in each region are formed of the same material. In other embodiments, the gate dielectric layers 130 in each region may be formed by distinct processes such that the gate dielectric layers 130 in different regions may be formed of different materials. The formation of the conductive fill layers 132C in the region 100N and the region 100P may occur simultaneously such that the conductive fill layers 132C in each region are formed of the same material. In other embodiments, the conductive fill layers 132C in each region may be formed by distinct processes such that the conductive fill layers 132C in different regions may be formed of different materials. Various masking steps may be used to mask and expose appropriate regions when using distinct processes.

Figure 12:
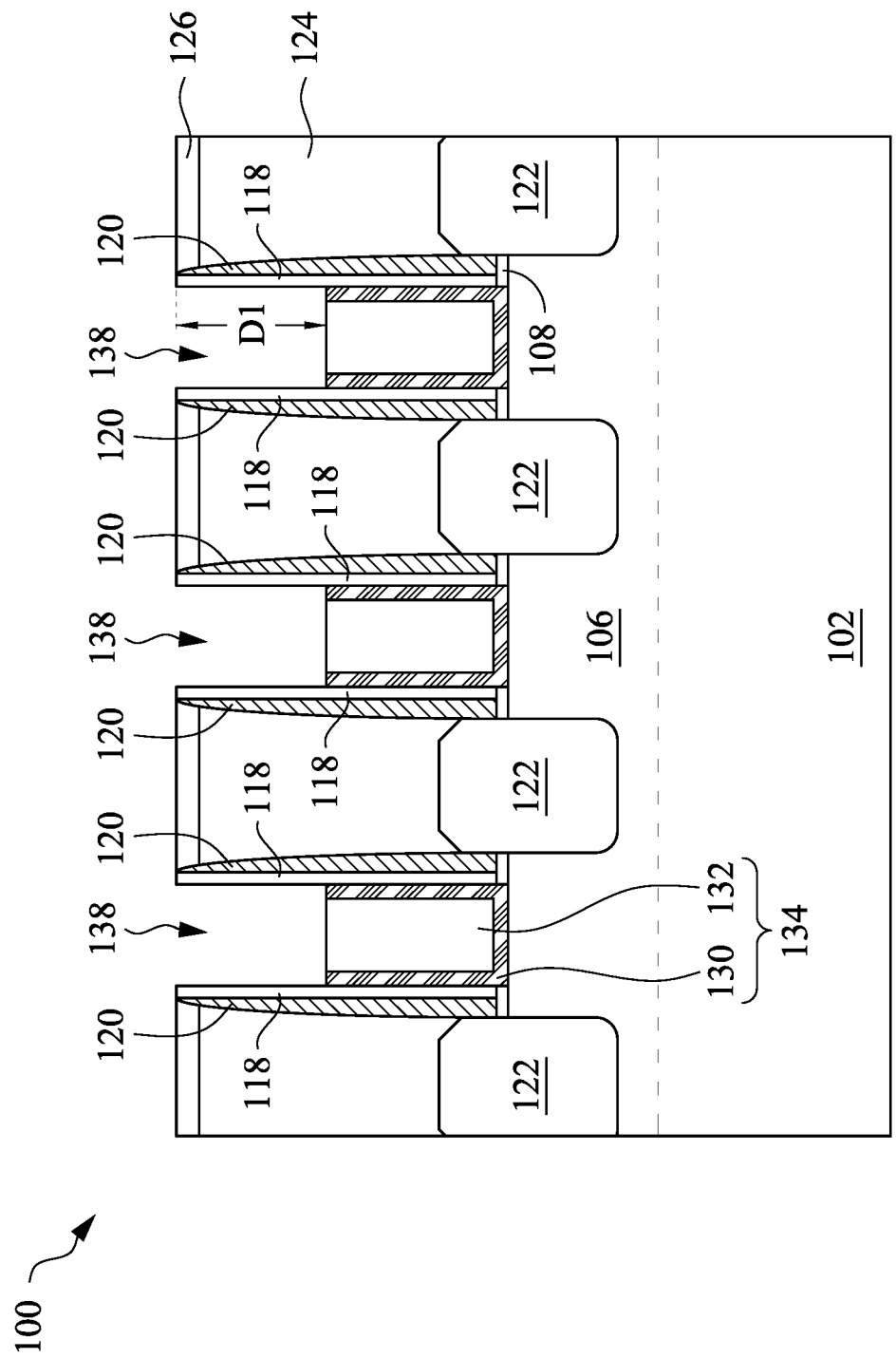

In FIG. 12, the gate stacks 134 are recessed below the top surface of the protection layer 126 to form recesses 138. In some embodiments, the recessing process comprises one or more etch processes. The one or more etch processes may comprise etch processes that are selective to materials of the gate stack 134 and do not substantially etch materials of the protection layer 126, the gate seal spacers 118, and the gate spacers 120. The recesses 138 extend below the top surface of the protection layer 126 to a depth D1. In some embodiments, the depth D1 is between about 25 nm and about 150 nm.

Figure 13:
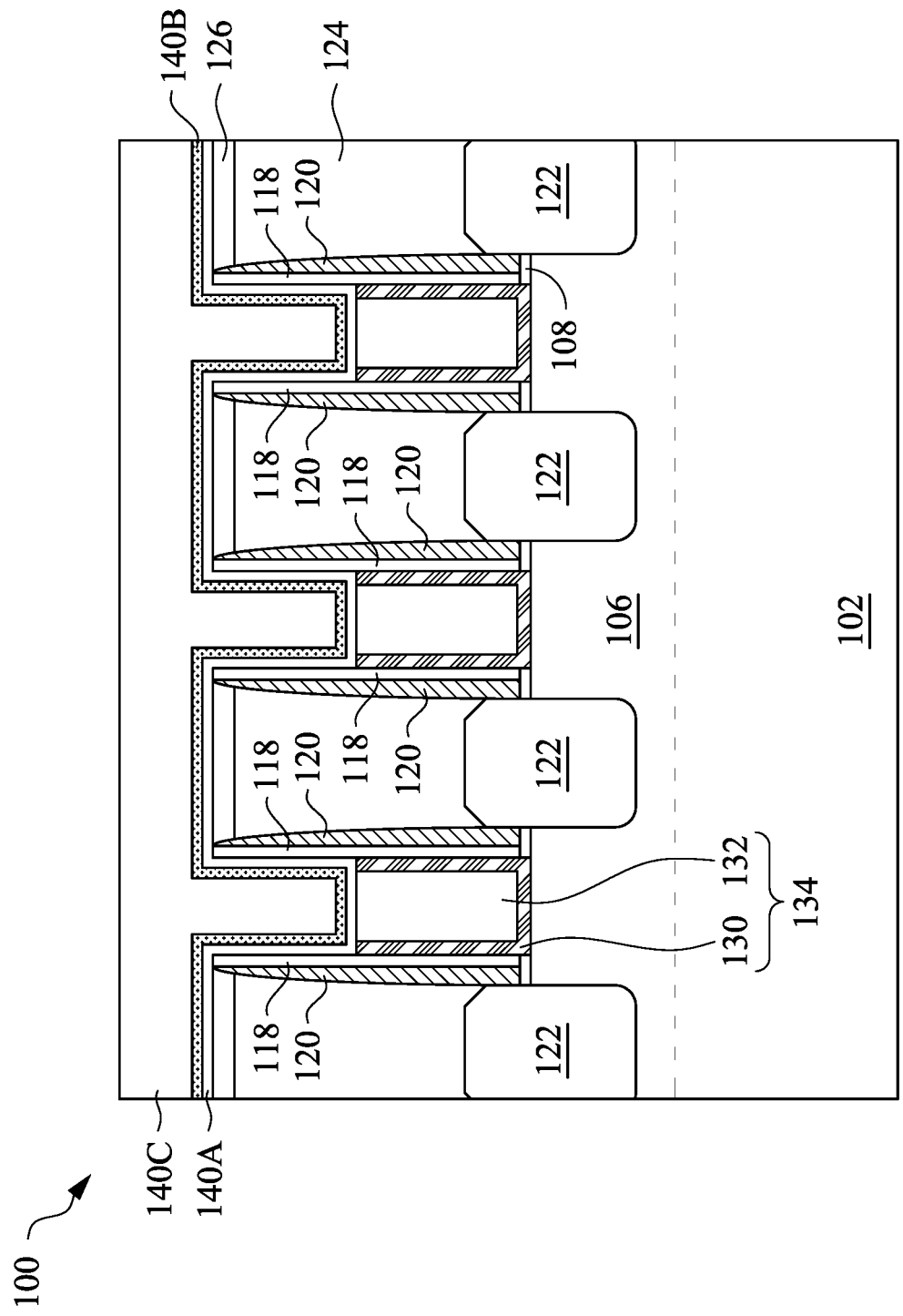
Figure 15:
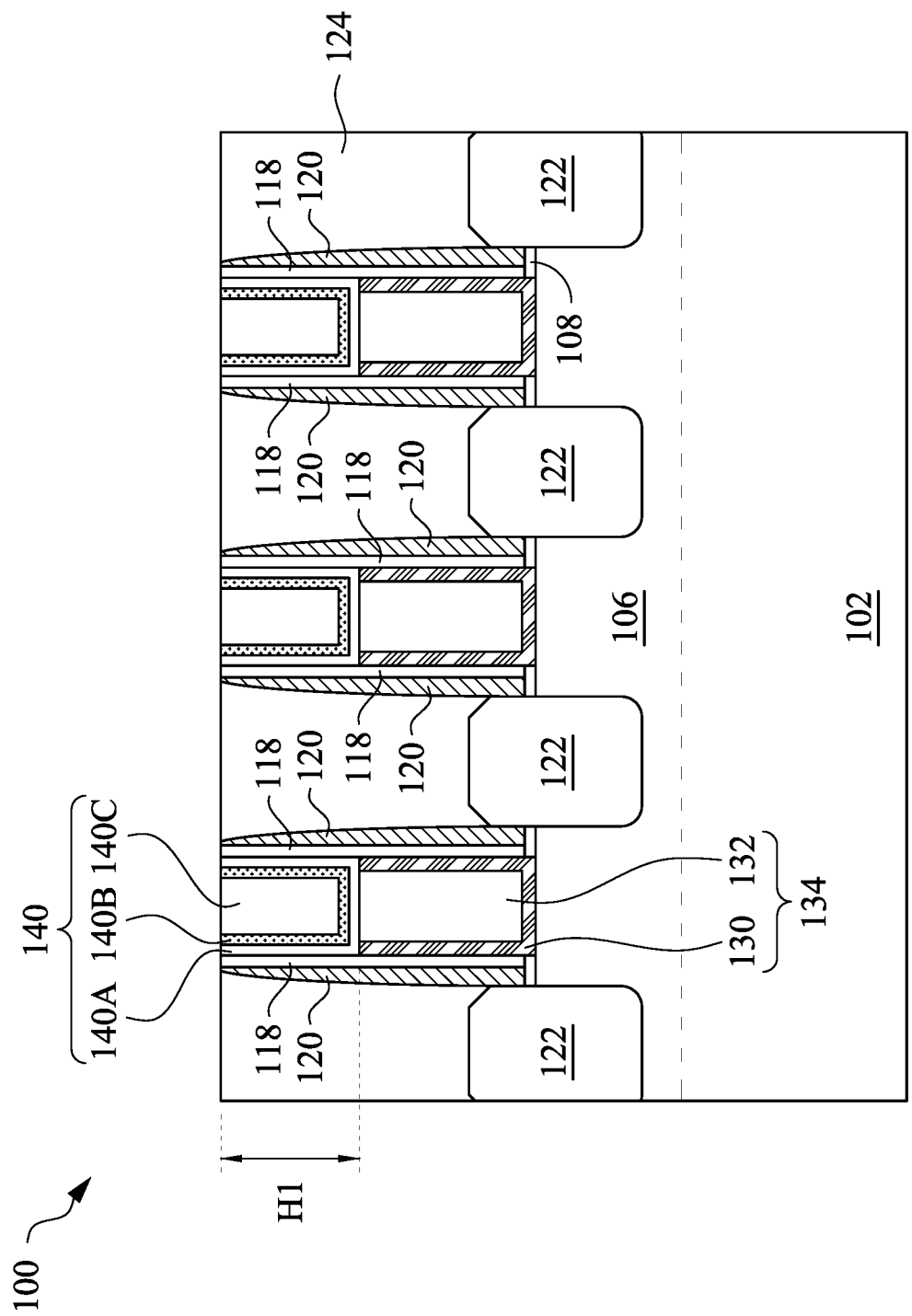

FIGS. 13 and 15 are cross-sectional views of intermediate stages in the manufacturing of hard masks 140 over the gate stacks 134 in accordance with some embodiments. In FIG. 13, a first layer 140A is formed along sidewalls and bottoms of the recesses 138 (see FIG. 12) and over the protection layer 126, a second layer 140B is formed over the first layer 140A, and a third layer 140C is formed over the second layer 140B. In some embodiments, the third layer 140C overfills the recesses 138 (see FIG. 12). In other embodiments, the third layer 140C is omitted. In such embodiments, the second layer 140B overfills the recesses 138 (see FIG. 12). The first layer 140A may be also referred to as a liner layer, the second layer 140B may be also referred to as a buttress layer, the third layer 140C may be also referred to as a capping layer, and the hard mask 140 may be also referred to as a self-aligned contact (SAC) hard mask. In some embodiments, the first layer 140A has a thickness between about 2 nm and about 10 nm. In some embodiments, the second layer 140B has a thickness between about 2 nm and about 10 nm. In some embodiments, the third layer 140C has a thickness between about 10 nm and about 30 nm.

FIG. 14 is a table illustrating various possible materials for the first layer 140A, the second layer 140B, and the third layer 140C of the hard mask 140 (see FIGS. 13 and 15) in accordance with some embodiments. In the embodiment #1, the first layer 140A comprises SiN, the second layer 140B comprises Si, a metal nitride material (such as TaN, TiN, AlN, or ZrN), or a metal oxide material (such as TiO, HfO, AlO, or ZrO), and the third layer 140C comprises SiN. In the embodiment #2, the first layer 140A comprises TiN, the second layer 140B comprises AlN, and the third layer 140C comprises SiN. In the embodiment #3, the first layer 140A comprises AlN, the second layer 140B comprises TiN, and the third layer 140C comprises SiN. In the embodiment #4, the first layer 140A comprises a metal nitride material (such as TiN, AlN, or ZrN) or a metal oxide material (such as TiO, HfO, AlO, or ZrO), the second layer 140B comprises SiN, and the third layer 140C is omitted. In the embodiment #5, the first layer 140A comprises SiN, the second layer 140B comprises a metal nitride material (such as TaN, AlN, or TiN), and the third layer 140C is omitted. In some embodiments, the hard masks 140 comprising metal oxide materials have better insulating properties than the hard masks 140 comprising metal nitride materials.

Referring back to FIG. 13, the first layer 140A, the second layer 140B, and the third layer 140C may be formed using a plasma-enhanced ALD (PEALD) process, a thermal ALD process, or the like. In some embodiments, the PEALD process is performed using a plasma system, such as 13.56 Hz capacitively-coupled plasma (CCP) system, with a power between about 100 W and 800 W and at a process temperature between about 200° C. and about 500° C. In some embodiments, the ALD process is performed at a process temperature between about 100° C. and about 400° C.

In some embodiments when the first layer 140A, the second layer 140B, or the third layer 140C are made of SiN, the PEALD or ALD processes are performed using a process gas mixture comprising a silicon precursor gas, a nitrogen precursor gas, and an additional gas. In some embodiments, the silicon precursor gas comprises $SiH_2I_2$ (diiodosilane) gas, the nitrogen precursor gas comprises $N_2$ gas, and the additional gas comprises $H_2$ gas. In other embodiments, the silicon precursor gas comprises $SiH_2Cl_2$ (dichlorosilane) gas, the nitrogen precursor gas comprises $N_2$ gas, $NH_3$ gas, or a mixture thereof, and the additional gas comprises Ar gas.

In some embodiments when the first layer 140A or the second layer 140B are made of TaN, the PEALD or ALD processes are performed using a process gas mixture comprising a tantalum precursor gas, a nitrogen precursor gas, and an additional gas. In some embodiments, the tantalum precursor gas comprises $TaCl_5$, $Ta(NMe_2)_5$, $Ta(OEt)_5$, $Ta(N^tBu)(NEt_2)_3$, $Ta(N^tPn)(NMe_2)_3$, $Ta(NMe_2)_5$, $TaF_5$, $Ta(N^tBu)(NEtMe)_3$, or $Ta(N^tPr)(NEtMe)_3$, the nitrogen precursor gas comprises $N_2$ gas, $NH_4$ gas, or a mixture thereof, and the additional gas comprises $H_2$ gas.

In some embodiments when the first layer 140A or the second layer 140B are made of TiN, the PEALD or ALD processes are performed using a process gas mixture comprising a titanium precursor gas, a nitrogen precursor gas, and an additional gas. In some embodiments, the titanium precursor gas comprises $TiCl_4$ or $Ti(NMe_2)_4$, the nitrogen precursor gas comprises $N_2$ gas, $NH_3$ gas, or a mixture thereof, and the additional gas comprises $H_2$ gas.

In some embodiments when the first layer 140A or the second layer 140B are made of HfO, the PEALD or ALD processes are performed using a process gas mixture comprising a hafnium precursor gas, an oxygen precursor gas, and an additional gas. In some embodiments, the hafnium precursor gas comprises $Hf(NEt_2)_4$, $Hf(NEtMe)_4$, $Hf(NMe_2)_4$, $Hf(OH)_3NH_2$, $Hf(mp)_4$, $Hf(O^tBu)_4$, the oxygen precursor gas comprises $O_2$ gas, and the additional gas comprises $N_2$ gas.

In some embodiments when the first layer 140A or the second layer 140B are made of TiO, the PEALD or ALD processes are performed using a process gas mixture comprising a titanium precursor gas and an oxygen precursor gas. In some embodiments, the titanium precursor gas comprises $TiCl_4$, or $Ti(NMe_2)_4$, and the oxygen precursor gas comprises $O_2$ gas, $H_2O$ gas, or a mixture thereof.

In some embodiments when the first layer 140A or the second layer 140B are made of AlO, the PEALD or ALD processes are performed using a process gas mixture comprising an aluminum precursor gas and an oxygen precursor gas. In some embodiments, the aluminum precursor gas comprises $AlH_3(MeNC_4H_4)$ or $AlMe_3$, and the oxygen precursor gas comprises $CO_2$ gas, $O_2$ gas, $H_2O$ gas, or a mixture thereof.

In some embodiments when the first layer 140A or the second layer 140B are made of AlN, the PEALD or ALD processes are performed using a process gas mixture comprising an aluminum precursor gas, a nitrogen precursor gas, and an additional gas. In some embodiments, the aluminum precursor gas comprises $AlH_3(MeNC_4H_4)$ or $AlMe_3$, the nitrogen precursor gas comprises $N_2$ gas, $NH_3$ gas, or a mixture thereof, and the additional gas comprises $H_2$ gas.

In some embodiments when the first layer 140A or the second layer 140B are made of ZrO, the PEALD or ALD processes are performed using a process gas mixture comprising a zirconium precursor gas, an oxygen precursor gas, and an additional gas. In some embodiments, the zirconium precursor gas comprises $Zr(NEt_2)_4$, $Zr(NEtMe)_4$, or $Zr(OtBu)_4$, the oxygen precursor gas comprises $O_2$ gas, and the additional gas comprises $N_2$ gas.

In FIG. 15, after the filling of the recesses 138 (see FIG. 12), a planarization process, such as a CMP, may be performed to remove the excess portions of the first layer 140A, the second layer 140B, and the third layer 140C, which excess portions are over the top surface of the ILD 124. In some embodiments, the planarization process also removes the protection layer 126 such that the top surface of the ILD 124 is exposed. The remaining portions of the first layer 140A, the second layer 140B, and the third layer 140C form the hard masks 140. After preforming the planarization process, top surfaces of the hard masks 140 are substantially co-planar or level with the top surface of the ILD 124 within process variations of the planarization process. In some embodiments, the hard masks 140 have a height H1 between about 50 nm and about 90 nm. In other embodiments, the hard masks 140 have the height H1 between about 10 nm and about 30 nm.

By forming the first layer 140A and/or the second layer 140B using materials as described above with reference to FIG. 14, sidewalls and corners of the hard masks 140 are reinforced and sidewall and corner loss in a subsequent etch process for forming openings for source/drain contacts is reduced or avoided.

Figure 16:
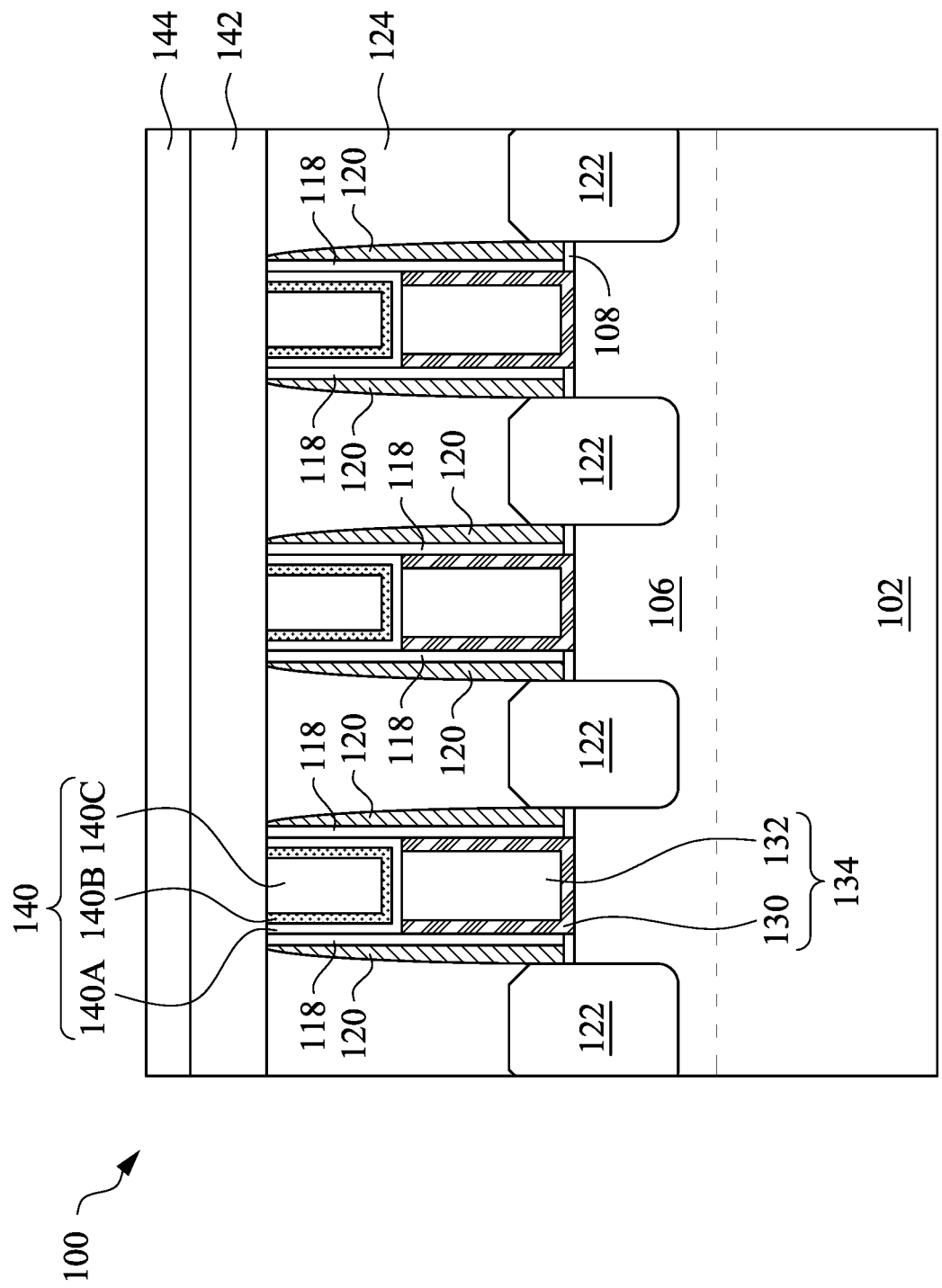

In FIG. 16, an ILD 142 is formed over the hard masks 140 and the ILD 124, and a hard mask 144 is formed over the ILD 142. In some embodiments, the ILD 142 may be formed using similar materials and methods as the ILD 124 and the description is not repeated herein. In some embodiments, the ILD 124 and ILD 142 comprise a same material. In other embodiments, the ILD 124 and ILD 142 comprise different materials. In some embodiments, the hard mask 144 may comprise TiN, WC, W, WCN, WN, Ti, SiN, SiC, SiCN, SiCO, a combination thereof, or the like, and may be formed using CVD, ALD, a combination thereof, or the like.

Figure 17:
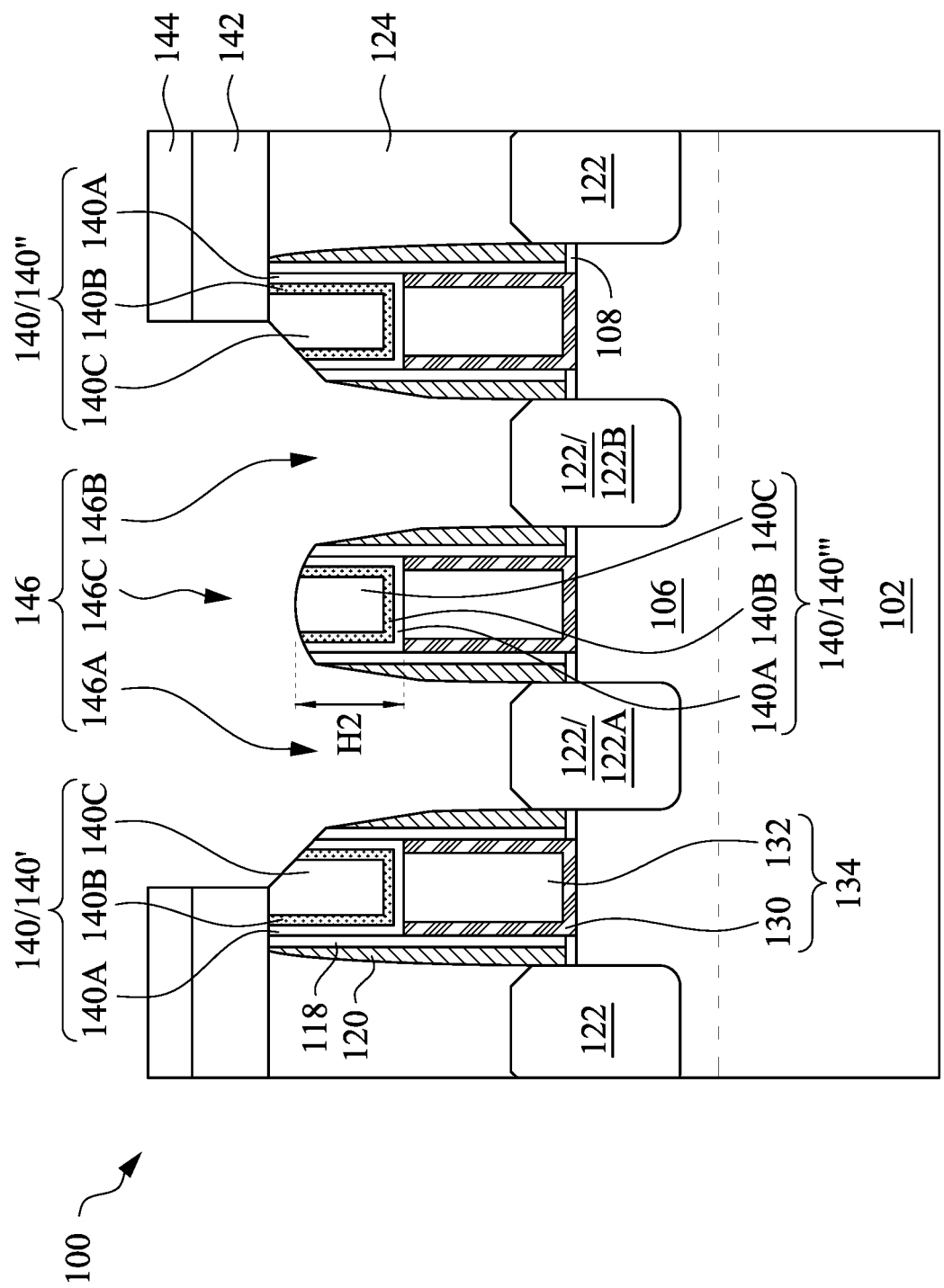

In FIG. 17, the hard mask 144 and the ILDs 124 and 142 are patterned to form an opening 146. In the illustrated embodiment, the opening 146 fully exposes the epitaxial source/drain regions 122A and 122B, fully exposes the hard mask 140''' interposed between the epitaxial source/drain region 122A and the epitaxial source/drain region 122B, partially exposes the hard mask 140' adjacent to the epitaxial source/drain region 122A, and partially exposes the hard mask 140'' adjacent to the epitaxial source/drain region 122B. In particular, the opening 146 comprises a first opening 146A exposing the epitaxial source/drain regions 122A, a second opening 146B exposing the epitaxial source/drain regions 122B, and a third opening 146C exposing the hard masks 140', 140'', and 140'''. In other embodiments, the opening 146 may expose any number of the epitaxial source/drain regions 122 and any number of the hard masks 140 according to design requirements of the semiconductor device 100.

In some embodiments, the patterning process for forming the opening 146 may comprise a first patterning process for patterning the hard mask 144 and a second patterning process for patterning the ILDs 124 and 142. In some embodiments, the first patterning process comprises suitable photolithography and etch processes. The first etch process of the first patterning process may be a dry etch process, a wet etch process, or the like. The first etch process may be anisotropic.

In some embodiments, the second patterning process comprises a second etch process that uses the patterned hard mask 144 as an etch mask and transfers a pattern of the patterned hard mask 144 to the ILDs 124 and 142. In some embodiments, the second etch process is an atomic layer etch (ALE) process and is performed using etchants comprising fluorocarbons (having a chemical formula CxFy, such as $CF_2$, $C_4F_6$, $C_3F_8$, $CH_3F$, or the like), $O_2$, $CO_2$, Ar, or N2, a combination thereof, or the like. In some embodiments, the second etch process may be anisotropic.

Further in FIG. 17, in some embodiments, the second etch process also etches the exposed hard masks 140', 140'', and 140''' such that corners of the exposed hard masks 140' and 140'' are removed and a height of the exposed hard masks 140''' is reduced. The exposed hard mask 140''' has a height H2 after completing the second etch process. In some embodiments, the height H2 of the exposed hard mask 140''' is less than the height H1 (see FIG. 15) of the un-etched hard mask 140. In some embodiments, the height H2 is between about 5 nm and about 25 nm. In some embodiments, a ratio of the height H2 to the height H1 (see FIG. 15) is between about 0.055 and about 1. By forming the first layer 140A and/or the second layer 140B of the hard masks 140 using materials as described above with reference to FIG. 14, sidewalls and corners of the hard masks 140', 140'', and 140''' are reinforced and sidewall, corner, and height losses are reduced or avoided.

Furthermore, in some embodiments, the second etch process also etches gate seal spacers 118 and gate spacers 120 that are disposed adjacent to the epitaxial source/drain regions 122A and 122B. In some embodiments, after completing the second etch process, a width of an etched gate seal spacer 118 decreases as the etched gate seal spacer 118 extends away from the active region 106, and a width of an etched gate spacer 120 decreases as the etched gate spacers 120 extends away from the active region 106.

Figure 18:
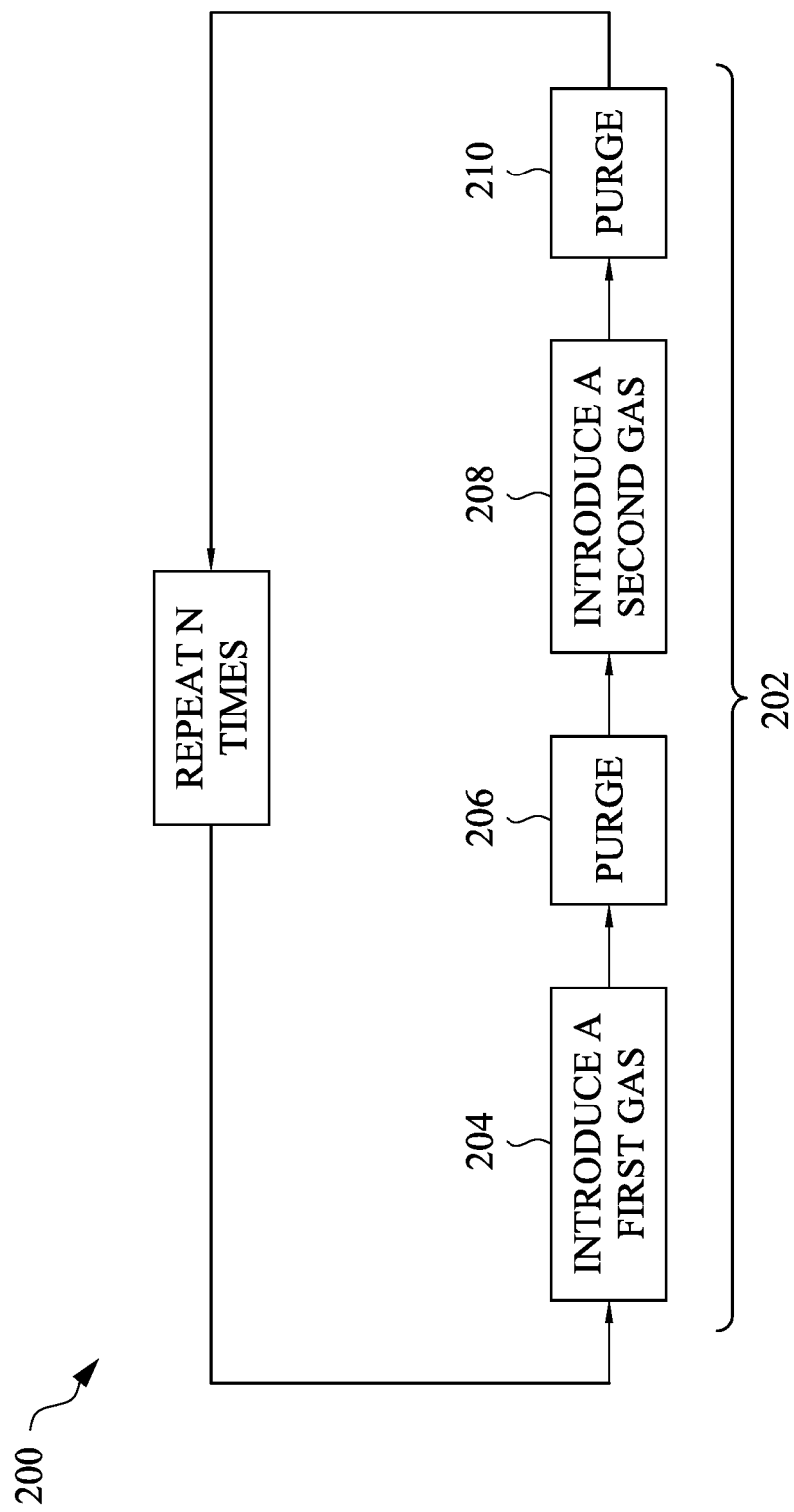
FIG. 18 is a flow diagram illustrating an atomic layer etch process in accordance with some embodiments.
Figure 19:
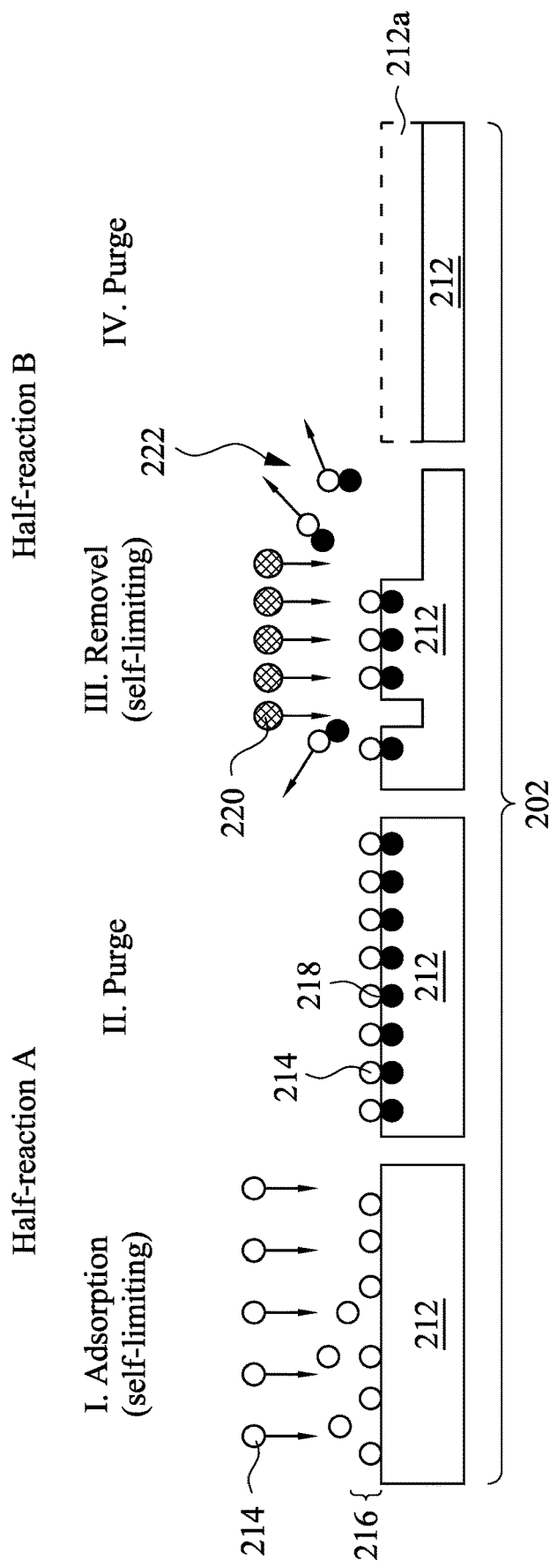
FIGS. 19 and 20 are cross-sectional views of intermediate stages while performing an atomic layer etch process in accordance with some embodiments.
Figure 20:
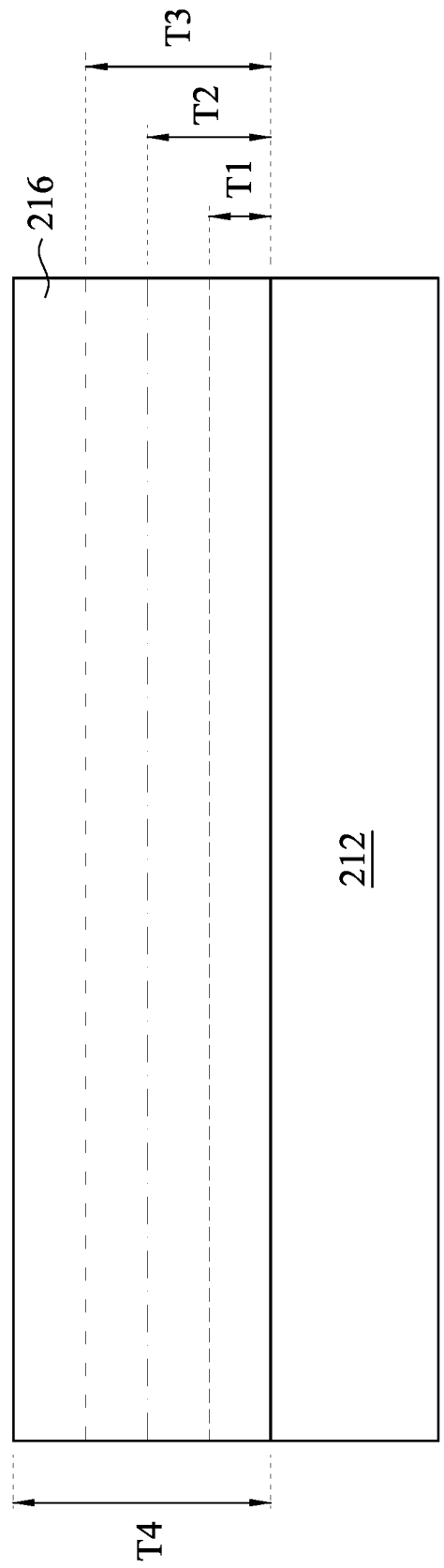

FIG. 18 is a flow diagram illustrating an ALE process 200 in accordance with some embodiments. FIGS. 19 and 20 are cross-sectional views of intermediate stages while performing the ALE process 200 in accordance with some embodiments. Referring to FIGS. 18 and 19, the ALE process 200 comprises performing an ALE cycle 202 N times. In some embodiments, N is between 1 and 50. In some embodiments, the ALE cycle 202 comprises performing a step 204, where a first gas 214 is introduced over a layer 212 that is to be etched (such as for example ILD layers 124 and 142 illustrated in FIG. 17). In some embodiments, the first gas 214 may comprise a fluorocarbon gas and may be ionized. In some embodiments, the first gas 214 is adsorbed on an exposed surface of the layer 212. In some embodiments, the first gas 214 is introduced for a time between about 0.1 sec and about 20 sec. In some embodiments, a flow rate of the first gas 214 between about 0.1 sccm and about 200 sccm.

In some embodiments, the adsorbed fluorocarbon gas forms a fluorocarbon polymer layer 216 over the layer 212. In some embodiments, a thickness of the fluorocarbon polymer layer 216 depends on a material of the layer 212 as illustrated in FIG. 20. In some embodiments when the layer 212 is made of silicon oxide, the fluorocarbon polymer layer 216 has a thickness T1 between about 0 nm and about 5 nm. In some embodiments when the layer 212 is made of silicon nitride, the fluorocarbon polymer layer 216 has a thickness T2 between about 0 nm and about 15 nm. In some embodiments when the layer 212 is made of silicon, the fluorocarbon polymer layer 216 has a thickness T3 between about 0 nm and about 20 nm. In some embodiments when the layer 212 is made of a metal oxide or a metal nitride, the fluorocarbon polymer layer 216 has a thickness T4 between about 0 nm and about 40 nm. In some embodiments, the thickness T1 is less than the thickness T2, the thickness T2 is less than the thickness T3, and the thickness T3 is less than the thickness T4. As described below in greater detail, a thickness of the fluorocarbon polymer layer 216 affects an etch rate of the layer 212, such that the layer 212 with a thicker fluorocarbon polymer layer has lower etch rate.

Referring further to FIGS. 18 and 19, in step 206, un-adsorbed portions of the first gas 214 are purged using a non-reactive gas such as $N_2$, Ar, a combination thereof, or the like. In some embodiments, the purge is performed for a time between 1 sec and about 10 sec. In some embodiments, a flow rate of the non-reactive gas may be between about 200 sccm and about 5000 sccm.

In step 208, a second gas 220 is introduced over the layer 212. In some embodiments, the second gas 220 comprises Ar gas, which is ionized to obtain $Ar^+$ ions. In some embodiments, the $Ar^+$ ions are accelerated toward the layer 212 and bombard the layer 212. Due to the bombardment, bonds between the atoms of the layer 212 are broken. In some embodiments when the layers 212 is made of silicon oxide, the bombardment with $Ar^+$ ions breaks bonds between silicon atoms 218 and oxygen atoms (not illustrated). Subsequently, molecules of the first gas 214 (such as, for example, fluorocarbon molecules) adsorbed on the layer 212 react with silicon atoms 218 to form a volatile by-product 222. In some embodiments, the fluorocarbon polymer layer 216 formed over the layer 212 protects the layer 212 from $Ar^+$ ion bombardment. In some embodiments, materials with a thicker fluorocarbon polymer layer formed thereon have fewer broken bonds, which results in creating fewer volatile by-products 222, and consequently, in lower etch rate.

In step 210, the volatile by-products 222 are purged using a non-reactive gas such as $N_2$, Ar, a combination thereof, or the like. In some embodiments, the purge is performed for a time between 1 sec and about 10 sec. In some embodiments, a flow rate of the non-reactive gas may be between about 200 sccm and about 5000 sccm. In some embodiments, the ALE cycle 202 etches an atomic layer 212a of the layer 212. The number of removed atomic layers of the layer 212 can be adjusted by altering the number of ALE cycles N.

Referring back to FIG. 17, materials of the hard masks 140 are chosen such that the hard masks 140 are not significantly etched, while etching the ILDs 124 and 142 using the ALE process 200 (see FIGS. 18 and 19). In some embodiments, by choosing materials of the first layer 140A and/or the second layer 140B as described above with reference to FIG. 14, the etch rate of the hard masks 140 is lower than the etch rate of the ILDs 124 and 142. In some embodiments, the materials of the first layer 140A and/or the second layer 140B as described above with reference to FIG. 14 have a high ion bombardment resistance and low sputter yield (due to high binding energy and high density), as well as, allow for forming a thick non-volatile fluorocarbon polymer layers for further protection from ion bombardment.

Figure 21:
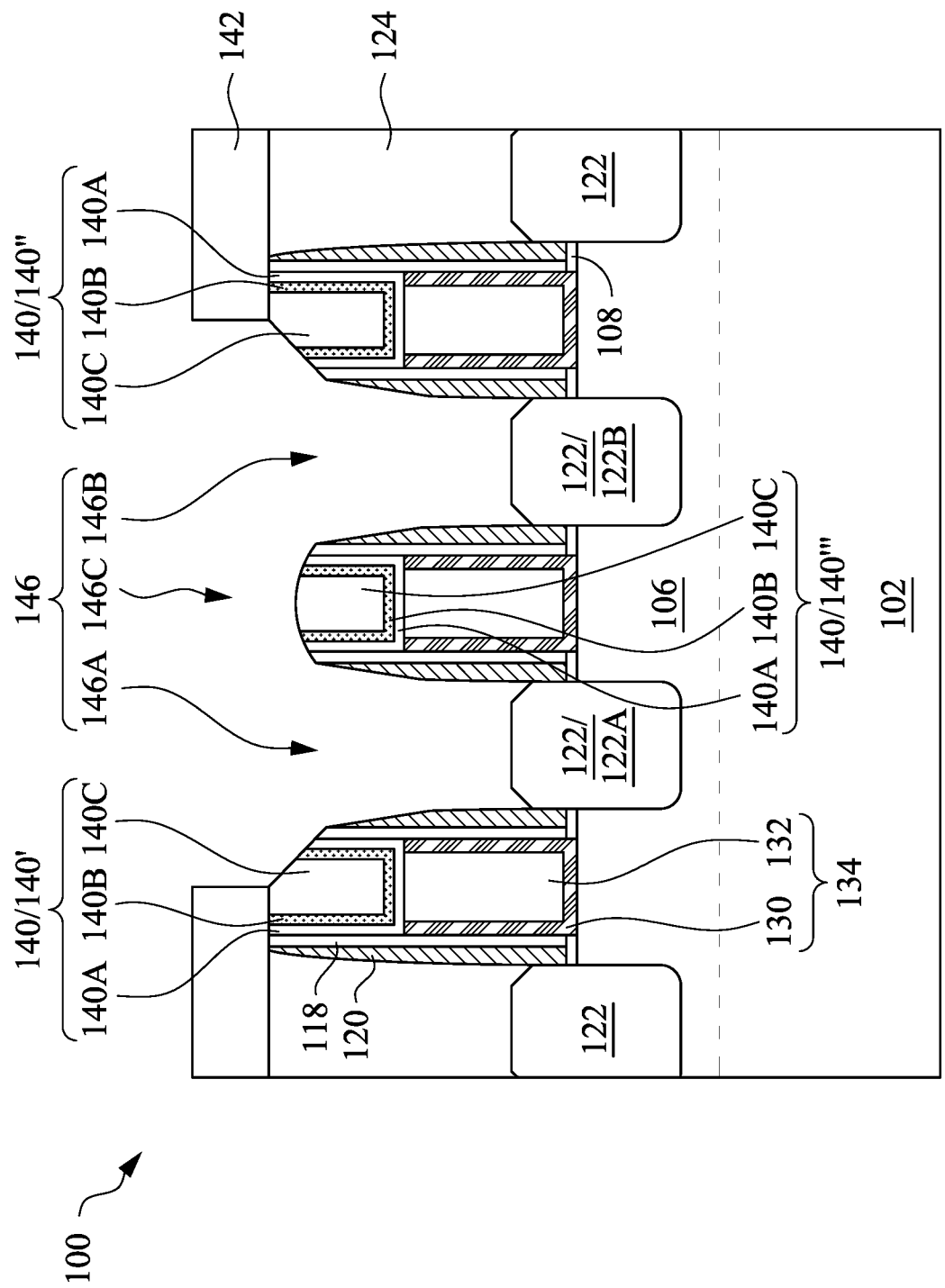

In FIG. 21, a cleaning process is performed on the exposed epitaxial source/drain regions 122A and 122B. In some embodiments, the cleaning process removes any residual oxide that may remain on the exposed epitaxial source/drain regions 122A and 122B after forming the opening 146. In some embodiments, the cleaning process also removes the hard mask 144 (see FIG. 17) and exposes the ILD 142. As described below in greater detail, in some embodiments, the cleaning process comprises performing an etch process using an etching system 300 (see FIG. 22) followed by performing a thermal treatment using a thermal apparatus 400 (see FIG. 23).

Figure 22:
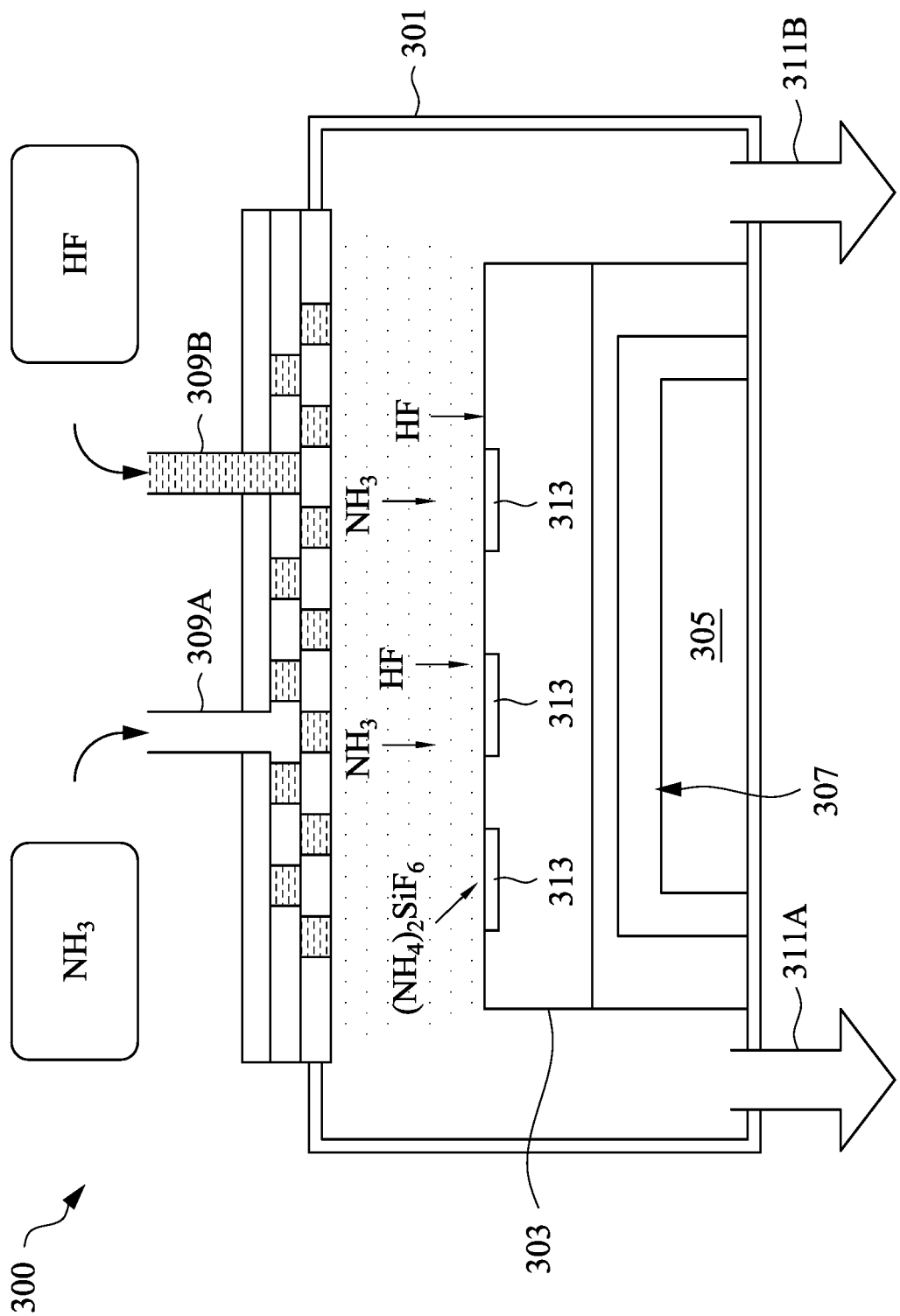

In FIG. 22, in some embodiments, a wafer 303 comprising the structure of FIG. 17 is introduced into a chamber 301 of the etching system 300. The etching system 300 comprises a platform 305 within the chamber 301 and the wafer 303 is placed on the platform 305. In some embodiments, the platform 305 comprises a cooling line 307, such as a water line, that is configured to maintain a temperature of the wafer 303 within a desired temperature range. In some embodiments, a temperature of the wafer 303 is between about 20° C. and about 90° C. In some embodiments, the etching system 300 further comprises inlets 309A and 309B, and outlets 311A and 311B. The inlets 309A and 309B are configured to introduce process gases into the chamber 301. The outlets 311A and 311B are configured to evacuated reaction by-products from the chamber 301. In some embodiments, the inlet 309A introduces $NH_3$ gas into the chamber 301 and the inlet 309B introduces HF gas into the chamber 301. In some embodiments, $NH_3$ gas and HF gas are mixed before introducing the gas mixture into the chamber 301.

In some embodiments, $NH_3$ and HF molecules are adsorbed onto a surface of the wafer 303 and react with residual oxide, such as silicon oxide, for example. The $NH_3$ and HF molecules react with silicon oxide through reactions (1) and (2):

$$SiO_2 + 4F + 4NH_3 \rightarrow SiF_4 + 2H_2O + 4NH_3 \quad (1)$$

$$SiF_4 + 2HF + 2NH_3 \rightarrow (NH_4)_2SiF_6. \quad (2)$$

As a result of the reactions (1) and (2), a compound layer 313 is formed on the surface of the wafer 303 at locations of the residual oxide. In some embodiments, the compound layer 313 comprises $(NH_4)_2SiF_6$.

Figure 23:
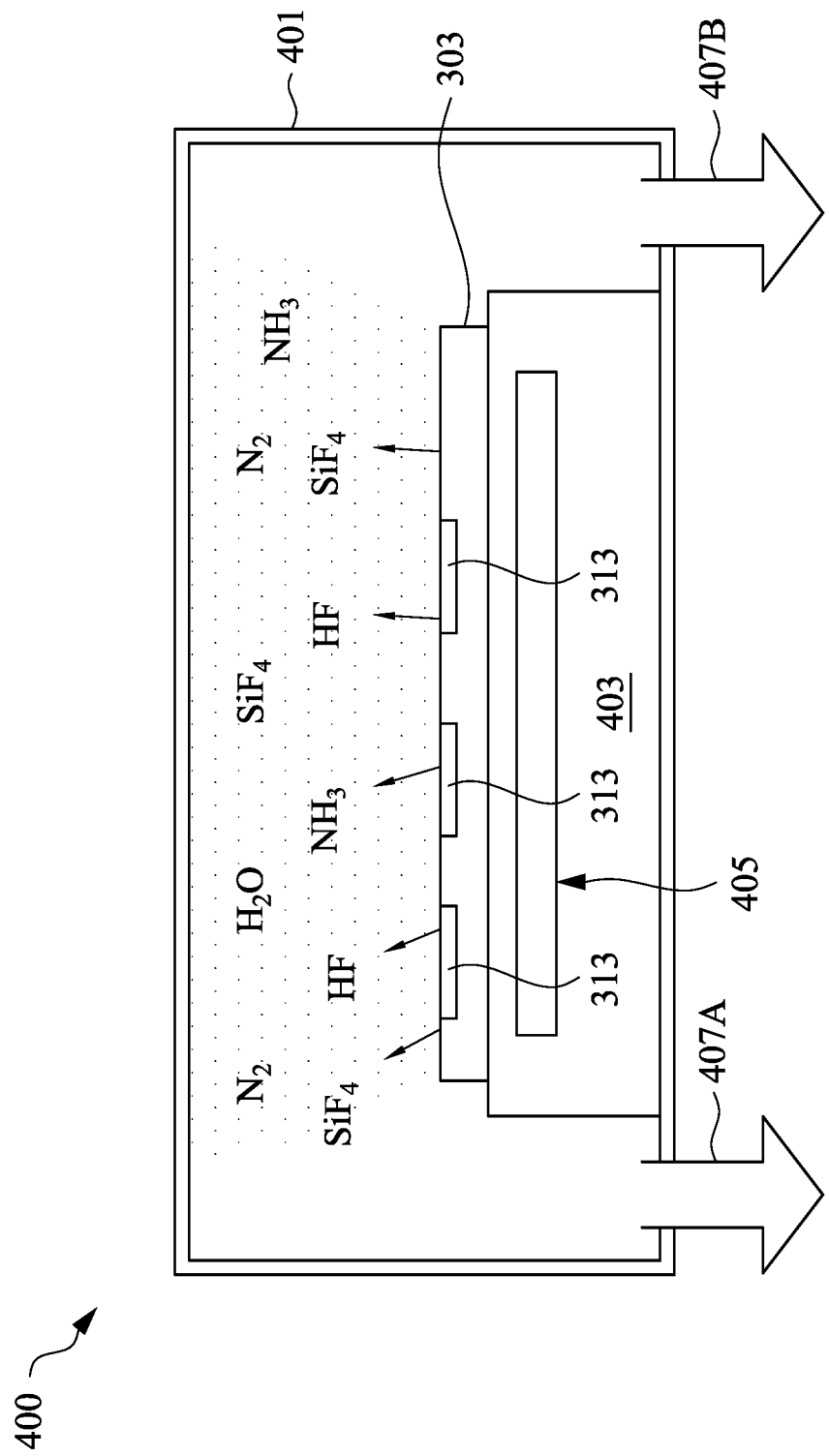

In FIG. 23, the wafer 303 is transferred into the thermal apparatus 400. The thermal apparatus 400 comprises a platform 403 within a chamber 401 and the wafer 303 is placed on the platform 403. In some embodiments, the platform 403 comprises a heater 405 that is configured to raise a temperature of the wafer 303 to a desired temperature. The heater 405 may comprise one or more heating elements, such as resistive heating elements, for example. In some embodiments, the wafer 303 is heated to a temperature between about 100° C. and about 200° C. for a duration between about 7 sec and about 120 sec. In some embodiments, the thermal treatment performed on the wafer 303 decomposes the compound layers 313 into volatile components through a chemical reaction (3)

$$(NH_4)_2SiF_6 \rightarrow SiF_4 + 2HF + 2NH_3 \quad (3)$$

Subsequently, the volatile components are evacuated from the chamber 401 through outlets 407A and 407B. In some embodiments, the thermal treatment process is performed in a non-reactive gas atmosphere, such as $N_2$ gas atmosphere, for example.

Figure 24:
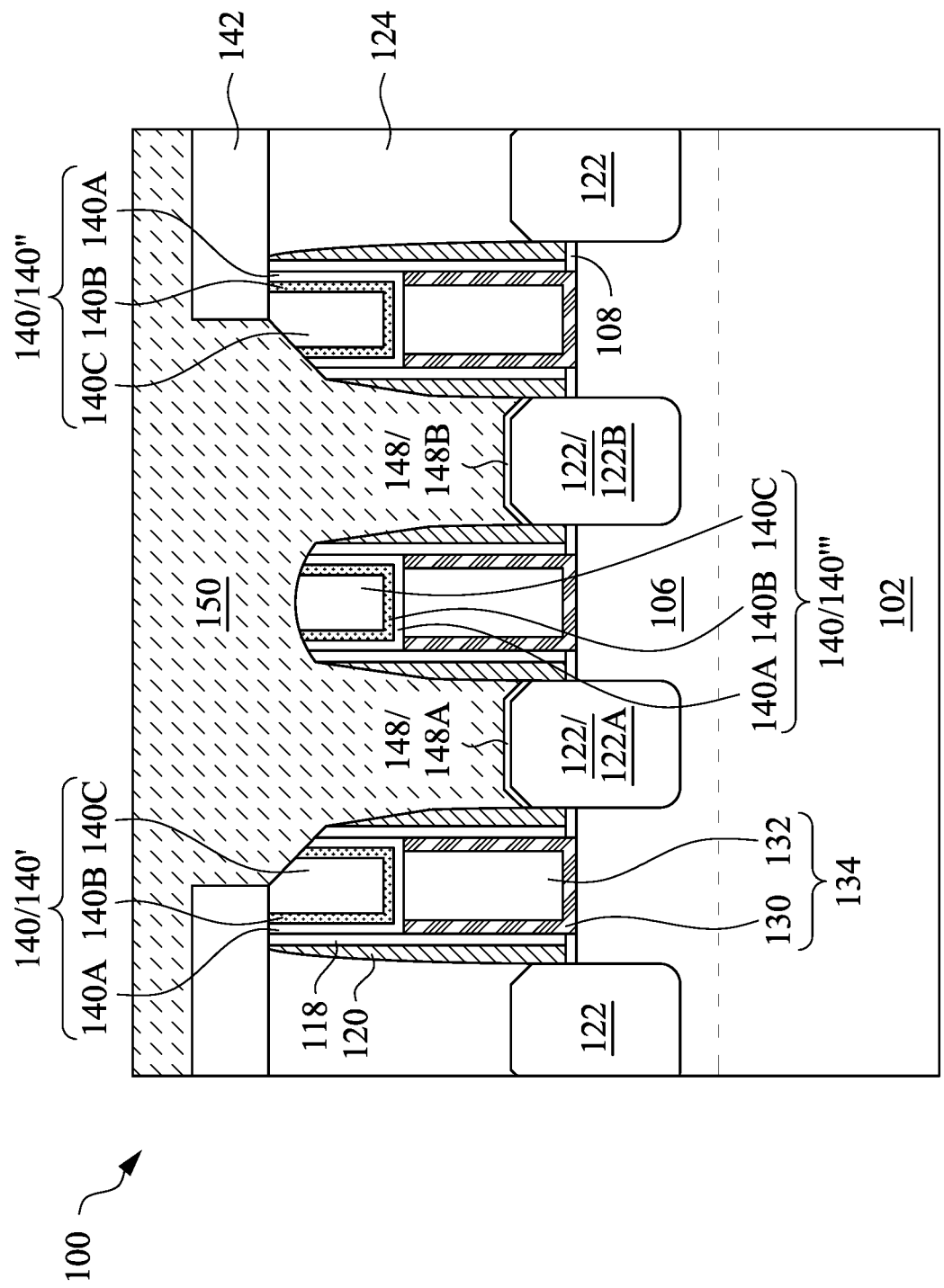
Figure 25:
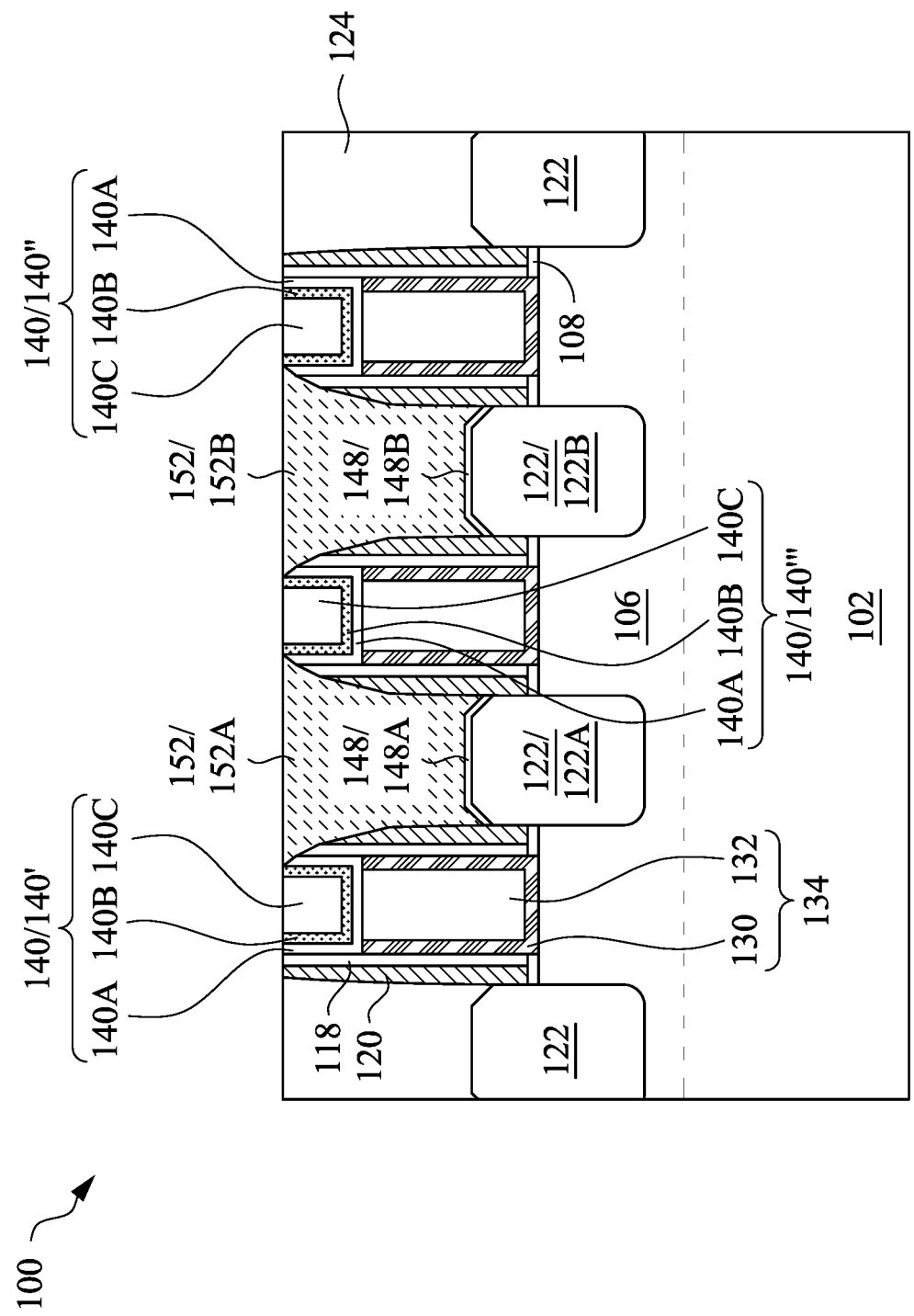

In FIGS. 24 and 25, source/drain contacts 152A and 152B are formed over the epitaxial source/drain regions 122A and 122B, respectively. In FIG. 24, after performing the cleaning process, silicide layers 148A and 148B are formed through the opening 146 (see FIG. 21) over the epitaxial source/drain regions 122A and 122B, respectively. In some embodiments, a metallic material is deposited in the opening 146. The metallic material may comprise Ti, Co, Ni, NiCo, Pt, NiPt, Ir, PtIr, Er, Yb, Pd, Rh, Nb, a combination thereof, or the like, and may be formed using PVD, sputtering, a combination thereof, or the like. Subsequently, an annealing process is performed to form the silicide layers 148A and 148B. In some embodiments where the epitaxial source/drain regions 122 comprise silicon, the annealing process causes the metallic material to react with silicon to form a silicide of the metallic material at interfaces between the metallic material and the epitaxial source/drain regions 122. After forming the silicide layers 148A and 148B, unreacted portions of the metallic material are removed using a suitable removal process, such as a suitable etch process, for example.

After forming the silicide layers 148A and 148B, a conductive layer 150 is formed in the opening 146 (see FIG. 21) and over the ILD 142. In some embodiments, the conductive layer 150 overfills the opening 146. In some embodiments, the conductive layer 150 is formed by first forming a barrier layer (not individually shown) in the opening 146 and over the ILD 142. The barrier layer may extend along a bottom and sidewalls of the opening 146. The barrier layer may comprise titanium, titanium nitride, tantalum, tantalum nitride, a combination thereof, a multilayer thereof, or the like, and may be formed by ALD, CVD, PVD, sputtering, a combination thereof, or the like. Subsequently, an adhesion layer (not individually shown) is formed over the barrier layer within the opening 146 and over the ILD 142. The adhesion layer may comprise cobalt, ruthenium, an alloy thereof, a combination thereof, a multilayer thereof, or the like, and may be formed by ALD, CVD, PVD, sputtering, a combination thereof, or the like. After forming the adhesion layer, a seed layer (not individually shown) is formed over the adhesion layer within the opening 146 and over the ILD 142. The seed layer may comprise copper, titanium, nickel, gold, manganese, a combination thereof, a multilayer thereof, or the like, and may be formed by ALD, CVD, PVD, sputtering, a combination thereof, or the like. Subsequently, a conductive fill material (not individually shown) is formed over the seed layer within the opening 146 and over the ILD 142. In some embodiments, the conductive fill material overfills the opening 146. The conductive fill material may comprise copper, aluminum, tungsten, ruthenium, cobalt, combinations thereof, alloys thereof, multilayers thereof, or the like, and may be formed using, for example, by plating, ALD, CVD, PVD, or other suitable methods.

In FIG. 25, after forming the conductive layer 150 (see FIG. 24), a planarization process is performed to remove portions of the conductive layer 150 overfilling the opening 146 (see FIG. 21). In some embodiments, the planarization process also removes the ILD 142 (see FIG. 24), portions of the ILD 124, portions of the hard masks 140, portions of the gate seal spacers 118, and portions of the gate spacers 120. Remaining portions of the conductive layer 150 form a source/drain contact 152A in the opening 146A (see FIG. 21) and a source/drain contact 152B in the opening 146B. The planarization process may comprise a CMP process, an etch back process, a grinding process, combinations thereof, or the like. After performing the planarization process, a top surface of the source/drain contact 152A, a top surface of the source/drain contact 152B, the top surface of the ILD 124, top surfaces of the hard masks 140, top surfaces of the gate seal spacers 118, and top surfaces of the gate spacers 120 are substantially level or coplanar with each other within process variations of the planarization process. By forming the hard masks 140 using materials as described above with reference to FIGS. 13-15, the hard mask 140''' is not substantially etched and good isolation between the source/drain contact 152A and the source/drain contact 152B is achieved.

In some embodiments, due to the etch process described above with reference to FIG. 17, a width of the hard mask 140' decreases as the hard mask 140' extends away from a top surface of a respective gate stack 134, a width of the hard mask 140'' decreases as the hard mask 140'' extends away from a top surface of a respective gate stack 134, and a width of the hard mask 140''' decreases as the hard mask 140''' extends away from a top surface of a respective gate stack 134. In some embodiments, a width of the source/drain contact 152A increases as the source/drain contact 152A extends away from the epitaxial source/drain region 122A, and a width of the source/drain contact 152B increases as the source/drain contact 152B extends away from the epitaxial source/drain region 122B.

Figure 26:
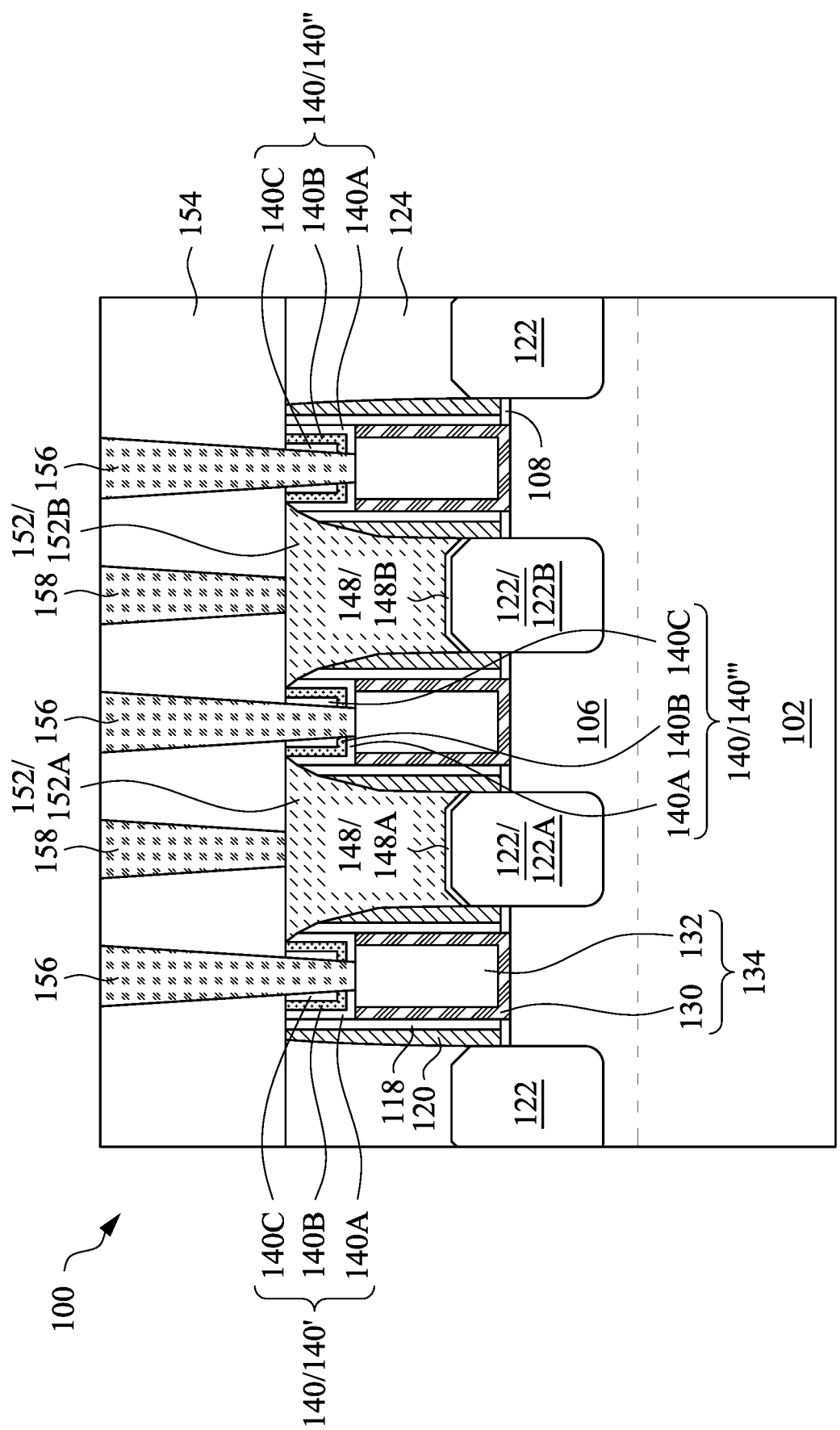

In FIG. 26, an ILD 154 is formed over the ILD 124, the hard masks 140, and the source/drain contacts 152. In some embodiments, the ILD 154 may be formed using similar materials and methods as the ILD 124 and the description is not repeated herein. In some embodiments, the ILDs 124 and 154 comprise a same material. In other embodiments, the ILDs 124 and 154 comprise different materials. In some embodiments, gate contacts 156 are formed in electrical contact with respective gate stacks 134 and conductive vias 158 are formed in electrical contact with respective source/drain contacts 152. In some embodiments, the ILD 154 and the hard masks 140 are patterned to form openings for the gate contacts 156 and the conductive vias 158. In some embodiments, the patterning process comprises suitable photolithography and etch processes. The suitable etch process may comprise one or more dry etch processes. The etch process may be anisotropic. The openings for the gate contacts 156 extend through the ILD 154 and respective hard masks 140, and expose respective gate stacks 134. The openings for the conductive vias 158 extend through the ILD 154 and expose respective source/drain contacts 152. After forming the openings, the gate contacts 156 and the conductive vias 158 are formed in the respective openings. In some embodiments, the gate contacts 156 and the conductive vias 158 may be formed using similar materials and methods as the source/drain contacts 152 and the description is not repeated herein.

Figure 27:
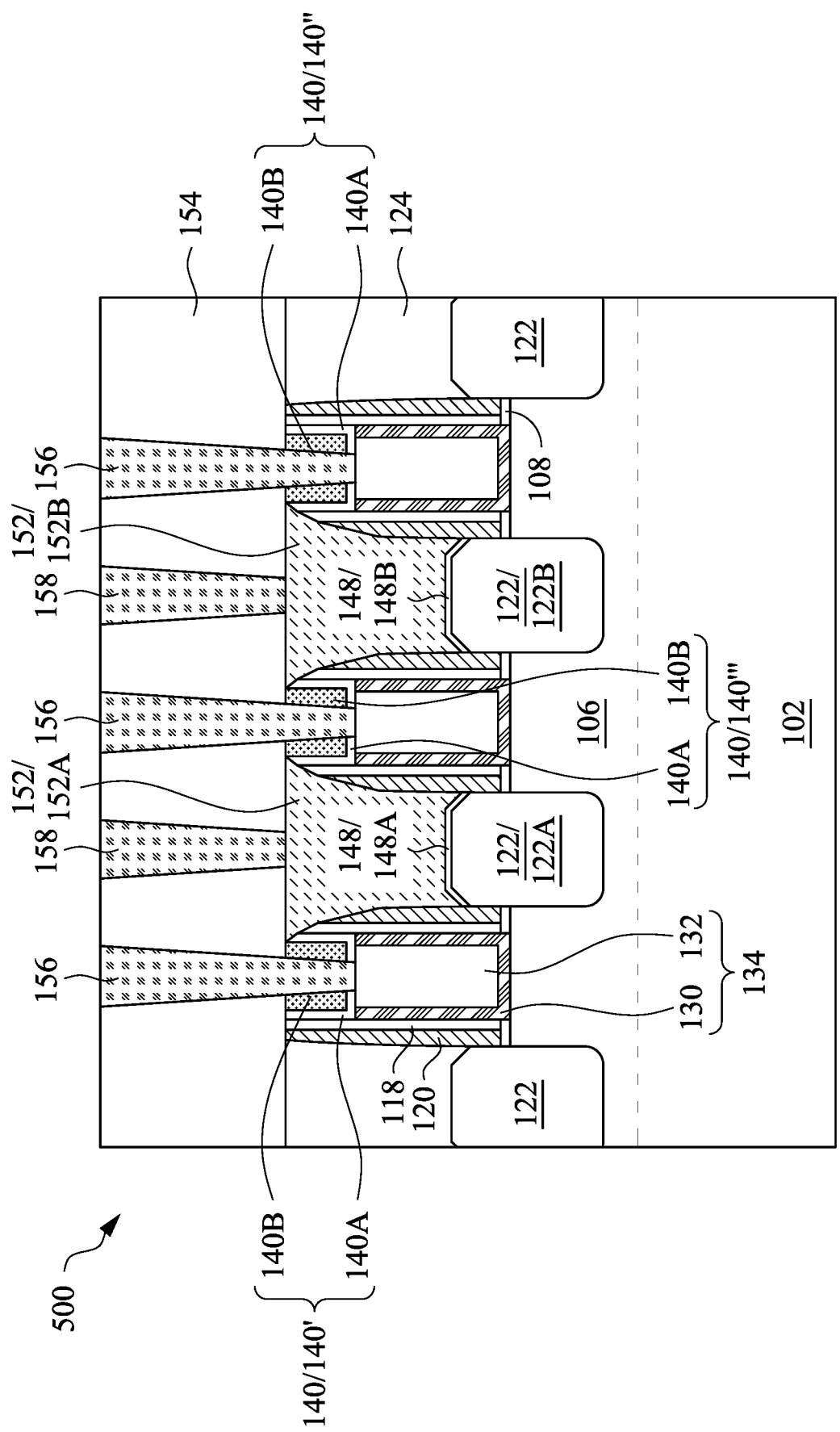
FIG. 27 is a cross-sectional view of a semiconductor device in accordance with some embodiments.

FIG. 27 illustrates a cross-sectional view of a semiconductor device 500 in accordance with some embodiments. The semiconductor device 500 is similar to the semiconductor device 100 (see FIG. 26), with similar features being labeled with similar numerical references, and descriptions of the similar features are not repeated herein. In some embodiments, the semiconductor device 500 may be formed using process steps similar to the process steps described above with reference to FIGS. 1-16, and the description in not repeated herein. In the illustrated embodiment, the hard masks 140 are formed such that layers 140C (see FIG. 26) are omitted.

In accordance with an embodiment, a device includes a substrate including an active region, a gate stack over the active region, and a hard mask over the gate stack. The hard mask includes a capping layer, a buttress layer extending along sidewalls and a bottom of the capping layer, and a liner layer extending along sidewalls and a bottom of the buttress layer. The buttress layer includes a metal oxide material or a metal nitride material.

Embodiments may include one or more of the following features. The device where the liner layer includes a first nitride material different from the metal nitride material. The device where the capping layer includes a second nitride material different from the metal nitride material. The device where the first nitride material is same as the second nitride material. The device where the first nitride material is different from the second nitride material. The device further including an epitaxial source/drain region extending into the active region adjacent to the gate stack. The device further including a source/drain contact over the epitaxial source/drain region, a top surface of the source/drain contact being level with a top surface of the hard mask.

In accordance with another embodiment, a device includes a substrate comprising an active region, a first spacer structure and a second spacer structure over the active region, a gate stack over the active region and between the first spacer structure and the second spacer structure, and a hard mask over the gate stack and between the first spacer structure and the second spacer structure. A first sidewall of the first spacer structure faces a second sidewall of the second spacer structure. A top surface of the gate stack is lower than a top surface of the first spacer structure and a top surface of the second spacer structure. The hard mask includes a liner layer extending along a top surface of the gate stack, the first sidewall of the first spacer structure and the second sidewall of the second spacer structure, a buttress layer over the liner layer, and a capping layer over the buttress layer. The liner layer includes a first nitride material. The buttress layer includes a second nitride material or a first oxide material. The capping layer includes a third nitride material. The device further includes an epitaxial source/drain region embedded in the active region adjacent to the first spacer structure and a source/drain contact over the epitaxial source/drain region and adjacent to the first spacer structure. A top surface of the source/drain contact is level with a top surface of the hard mask.

Embodiments may include one or more of the following features. The device where a width of the first spacer structure decreases as the first spacer structure extends away from the active region. The device where a width of the second spacer structure decreases as the second spacer structure extends away from the active region. The device where a width of the source/drain contact increases as the source/drain contact extends away from the epitaxial source/drain region. The device where the first nitride material includes SiN, the second nitride material includes TaN, TiN, AlN, or ZrN, and the third nitride material includes SiN. The device where the first nitride material includes SiN, the first oxide material includes TiO, HfO, AlO, or ZrO, and the third nitride material includes SiN. The device where the first nitride material includes TiN or AlN, the second nitride material includes TiN or AlN, and the third nitride material includes SiN.

In accordance with yet another embodiment, a method includes forming a dummy gate structure over an active region of a substrate, the dummy gate structure having a first sidewall and a second sidewall opposite to the first sidewall, forming a first spacer structure on the first sidewall of the dummy gate structure, forming a second spacer structure on the second sidewall of the dummy gate structure, replacing the dummy gate structure with a replacement gate structure, recessing the replacement gate structure to form a recess interposed between the first spacer structure and the second spacer structure, and forming a hard mask in the recess. Forming the hard mask includes forming a liner layer along sidewalls and a bottom of the recess, forming a buttress layer over the liner layer in the recess, and forming a capping layer over the buttress layer in the recess. The buttress layer includes a metal nitride material or a metal oxide material.

Embodiments may include one or more of the following features. The method further including forming an epitaxial source/drain region in the active region adjacent to the first spacer structure. The method further including forming a source/drain contact over the epitaxial source/drain region and adjacent to the first spacer structure, a top surface of the source/drain contact being level with a top surface of the hard mask. The method where the liner layer and the buttress layer include different materials. The method where the capping layer and the buttress layer include different materials. The method where the metal nitride material is TaN, TiN, AlN, or ZrN, and where the metal oxide material is TiO, HfO, AlO, or ZrO.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
    a substrate comprising an active region;
    a gate stack over the active region; and
    a hard mask over the gate stack, the hard mask comprising:
        a capping layer;
        a buttress layer extending along sidewalls and a bottom of the capping layer, wherein the buttress layer comprises a metal oxide material or a metal nitride material; and
        a liner layer extending along sidewalls and a bottom of the buttress layer.

2. The device of claim 1, wherein the liner layer comprises a first nitride material different from the metal nitride material.

3. The device of claim 2, wherein the capping layer comprises a second nitride material different from the metal nitride material.

4. The device of claim 3, wherein the first nitride material is same as the second nitride material.

5. The device of claim 3, wherein the first nitride material is different from the second nitride material.

6. The device of claim 1, further comprising an epitaxial source/drain region extending into the active region adjacent to the gate stack.

7. The device of claim 6, further comprising a source/drain contact over the epitaxial source/drain region, a top surface of the source/drain contact being level with a top surface of the hard mask.

8. A device comprising:
    a substrate comprising an active region;
    a first spacer structure and a second spacer structure over the active region, a first sidewall of the first spacer structure facing a second sidewall of the second spacer structure;
    a gate stack over the active region and between the first spacer structure and the second spacer structure, wherein a top surface of the gate stack is lower than a top surface of the first spacer structure and a top surface of the second spacer structure;
    a hard mask over the gate stack and between the first spacer structure and the second spacer structure, the hard mask comprising:
        a liner layer extending along a top surface of the gate stack, the first sidewall of the first spacer structure and the second sidewall of the second spacer structure, the liner layer comprising a first nitride material;
        a buttress layer over the liner layer, the buttress layer comprising a second nitride material or a first oxide material; and
        a capping layer over the buttress layer, the capping layer comprising a third nitride material;
    an epitaxial source/drain region embedded in the active region adjacent to the first spacer structure; and
    a source/drain contact over the epitaxial source/drain region and adjacent to the first spacer structure, a top surface of the source/drain contact being level with a top surface of the hard mask.

9. The device of claim 8, wherein a width of the first spacer structure decreases as the first spacer structure extends away from the active region.

10. The device of claim 9, wherein a width of the second spacer structure decreases as the second spacer structure extends away from the active region.

11. The device of claim 8, wherein a width of the source/drain contact increases as the source/drain contact extends away from the epitaxial source/drain region.

12. The device of claim 8, wherein the first nitride material comprises SiN, wherein the second nitride material comprises TaN, TiN, AlN, or ZrN, and wherein the third nitride material comprises SiN.

13. The device of claim 8, wherein the first nitride material comprises SiN, wherein the first oxide material comprises TiO, HfO, AlO, or ZrO, and wherein the third nitride material comprises SiN.

14. The device of claim 8, wherein the first nitride material comprises TiN or AlN, wherein the second nitride material comprises TiN or AlN, and wherein the third nitride material comprises SiN.

15. A method comprising:
forming a dummy gate structure over an active region of a substrate, the dummy gate structure having a first sidewall and a second sidewall opposite to the first sidewall;
forming a first spacer structure on the first sidewall of the dummy gate structure;
forming a second spacer structure on the second sidewall of the dummy gate structure;
replacing the dummy gate structure with a replacement gate structure;
recessing the replacement gate structure to form a recess interposed between the first spacer structure and the second spacer structure; and
forming a hard mask in the recess, wherein forming the hard mask comprises:
forming a liner layer along sidewalls and a bottom of the recess;
forming a buttress layer over the liner layer in the recess, the buttress layer comprising a metal nitride material or a metal oxide material; and
forming a capping layer over the buttress layer in the recess.

16. The method of claim 15, further comprising forming an epitaxial source/drain region in the active region adjacent to the first spacer structure.

17. The method of claim 16, further comprising forming a source/drain contact over the epitaxial source/drain region and adjacent to the first spacer structure, a top surface of the source/drain contact being level with a top surface of the hard mask.

18. The method of claim 15, wherein the liner layer and the buttress layer comprise different materials.

19. The method of claim 15, wherein the capping layer and the buttress layer comprise different materials.

20. The method of claim 15, wherein the metal nitride material is TaN, TiN, AlN, or ZrN, and wherein the metal oxide material is TiO, HfO, AlO, or ZrO.

* * * * *